United States Patent
Tsuchi et al.

(10) Patent No.: US 7,812,752 B2
(45) Date of Patent: Oct. 12, 2010

(54) DIGITAL-TO-ANALOG CONVERTER CIRCUIT, DATA DRIVER AND DISPLAY DEVICE

(75) Inventors: Hiroshi Tsuchi, Kanagawa (JP); Noboru Okuzono, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 65 days.

(21) Appl. No.: 12/289,266

(22) Filed: Oct. 23, 2008

(65) Prior Publication Data
US 2009/0109077 A1    Apr. 30, 2009

(30) Foreign Application Priority Data
Oct. 25, 2007    (JP)    ............... 2007-277710

(51) Int. Cl.
H03M 1/66    (2006.01)
(52) U.S. Cl. ........................... 341/144; 341/156
(58) Field of Classification Search .............. 341/144, 341/141, 123, 145; 345/204.87
See application file for complete search history.

(56) References Cited

U.S. PATENT DOCUMENTS

| | | | | |
|---|---|---|---|---|
| 5,923,277 | A * | 7/1999 | Takeda | .................. 341/156 |
| 6,166,674 | A * | 12/2000 | Wingender et al. | .......... 341/158 |
| 6,373,419 | B1 | 4/2002 | Nakao | |
| 6,441,763 | B1 | 8/2002 | Nakao | |
| 6,535,189 | B1 | 3/2003 | Akiyama et al. | |
| 7,091,937 | B2 * | 8/2006 | Nakamura | .................. 345/76 |
| 7,521,896 | B2 * | 4/2009 | Yudahira et al. | ............ 320/133 |
| 2002/0033763 | A1 | 3/2002 | Nakao | |
| 2007/0070022 | A1 | 3/2007 | Tsuchi et al. | |
| 2007/0171113 | A1 | 7/2007 | Lan | |

FOREIGN PATENT DOCUMENTS

| | | |
|---|---|---|
| JP | 2000-183747 | 6/2000 |
| JP | 2001-34234 | 2/2001 |
| JP | 2002-43944 | 2/2002 |
| JP | 2007-89074 | 4/2007 |
| JP | 2007-195018 | 8/2007 |

OTHER PUBLICATIONS

Japanese Office Action dated Jul. 17, 2009, with partial English translation.

* cited by examiner

*Primary Examiner*—Peguy JeanPierre
(74) *Attorney, Agent, or Firm*—McGinn IP Law Group PLLC

(57) ABSTRACT

A digital-to-analog converter circuit includes: a first subdecoder for receiving a first reference voltage group and selecting a reference voltage Vrk based upon an input digital signal; a second subdecoder for receiving a second reference voltage group and selecting a reference voltage Vr(k+1) based upon the input digital signal; a third subdecoder for receiving a third reference voltage group and selecting a reference voltage Vr(k+2) based upon the input digital signal; a fourth subdecoder for receiving the reference voltages that have been selected by respective ones of the first to third subdecoders, selecting two of these reference voltages (inclusive of selecting the same voltage redundantly) based upon an input digital signal, and outputting the selected two reference voltages; and an amplifier circuit for receiving the two reference voltages that have been selected by the fourth subdecoder and outputting a result of an operation applied to the two reference voltages.

22 Claims, 24 Drawing Sheets

FIG. 5B

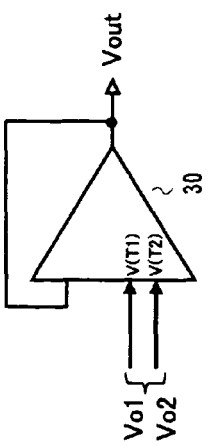

INTERPOLATING AMPLIFIER 30 WITH TWO (P=2) INPUT TERMINALS

INTERPOLATING AMPLIFIER OUTPUT:
Vout = {V(T1)+V(T2)}/2

FIG. 5A

EXEMPLARY EMBODIMENT WHERE m=8, n=2, h=64 HOLDS

| level | Vref | (2h+1) REFERENCE VOLTAGES (Vo1,Vo2) T1 T2 | | | D7 | D6 | D5 | D4 (m−n) BITS | D3 | D2 | D1 | D0 n BITS |
|---|---|---|---|---|---|---|---|---|---|---|---|---|
| 0 | Vref | Vr1 | Vr1 | Vr1 | 0 | 0 | 0 | 0 | 0 | 0 | 0 | 0 |
| 1 | | Vr2 | Vr1 | Vr2 | 0 | 0 | 0 | 0 | 0 | 0 | 0 | 1 |
| 2 | Vr2 | Vr2 | Vr2 | Vr2 | 0 | 0 | 0 | 0 | 0 | 0 | 1 | 0 |
| 3 | | Vr3 | Vr2 | Vr3 | 0 | 0 | 0 | 0 | 0 | 0 | 1 | 1 |
| 4 | Vr3 | Vr3 | Vr3 | Vr3 | 0 | 0 | 0 | 0 | 0 | 1 | 0 | 0 |
| 5 | | Vr4 | Vr3 | Vr4 | 0 | 0 | 0 | 0 | 0 | 1 | 0 | 1 |
| 6 | Vr4 | Vr4 | Vr4 | Vr4 | 0 | 0 | 0 | 0 | 0 | 1 | 1 | 0 |
| 7 | | Vr5 | Vr4 | Vr5 | 0 | 0 | 0 | 0 | 0 | 1 | 1 | 1 |
| 8 | Vr5 | Vr5 | Vr5 | Vr5 | 0 | 0 | 0 | 0 | 1 | 0 | 0 | 0 |
| 9 | | Vr6 | Vr5 | Vr6 | 0 | 0 | 0 | 0 | 1 | 0 | 0 | 1 |
| 10 | Vr6 | Vr6 | Vr6 | Vr6 | 0 | 0 | 0 | 0 | 1 | 0 | 1 | 0 |
| 11 | | Vr7 | Vr6 | Vr7 | 0 | 0 | 0 | 0 | 1 | 0 | 1 | 1 |
| 12 | Vr7 | Vr7 | Vr7 | Vr7 | 0 | 0 | 0 | 0 | 1 | 1 | 0 | 0 |
| 13 | | Vr8 | Vr7 | Vr8 | 0 | 0 | 0 | 0 | 1 | 1 | 0 | 1 |
| 14 | Vr8 | Vr8 | Vr8 | Vr8 | 0 | 0 | 0 | 0 | 1 | 1 | 1 | 0 |
| 15 | | Vr9 | Vr8 | Vr9 | 0 | 0 | 0 | 0 | 1 | 1 | 1 | 1 |
| 16 | Vr9 | Vr9 | Vr9 | Vr9 | 0 | 0 | 0 | 1 | 0 | 0 | 0 | 0 |
| 239 | | Vr121 | Vr121 | Vr121 | 1 | 1 | 1 | 0 | 1 | 1 | 1 | 1 |
| 240 | Vr121 | Vr121 | Vr121 | Vr121 | 1 | 1 | 1 | 1 | 0 | 0 | 0 | 0 |
| 241 | | Vr122 | Vr121 | Vr122 | 1 | 1 | 1 | 1 | 0 | 0 | 0 | 1 |
| 242 | Vr122 | Vr122 | Vr122 | Vr122 | 1 | 1 | 1 | 1 | 0 | 0 | 1 | 0 |
| 243 | | Vr123 | Vr122 | Vr123 | 1 | 1 | 1 | 1 | 0 | 0 | 1 | 1 |
| 244 | Vr123 | Vr123 | Vr123 | Vr123 | 1 | 1 | 1 | 1 | 0 | 1 | 0 | 0 |
| 245 | | Vr124 | Vr123 | Vr124 | 1 | 1 | 1 | 1 | 0 | 1 | 0 | 1 |
| 246 | Vr124 | Vr124 | Vr124 | Vr124 | 1 | 1 | 1 | 1 | 0 | 1 | 1 | 0 |
| 247 | | Vr125 | Vr124 | Vr125 | 1 | 1 | 1 | 1 | 0 | 1 | 1 | 1 |
| 248 | Vr125 | Vr125 | Vr125 | Vr125 | 1 | 1 | 1 | 1 | 1 | 0 | 0 | 0 |
| 249 | | Vr126 | Vr125 | Vr126 | 1 | 1 | 1 | 1 | 1 | 0 | 0 | 1 |
| 250 | Vr126 | Vr126 | Vr126 | Vr126 | 1 | 1 | 1 | 1 | 1 | 0 | 1 | 0 |
| 251 | | Vr127 | Vr126 | Vr127 | 1 | 1 | 1 | 1 | 1 | 0 | 1 | 1 |
| 252 | Vr127 | Vr127 | Vr127 | Vr127 | 1 | 1 | 1 | 1 | 1 | 1 | 0 | 0 |
| 253 | | Vr128 | Vr127 | Vr128 | 1 | 1 | 1 | 1 | 1 | 1 | 0 | 1 |
| 254 | Vr128 | Vr128 | Vr128 | Vr128 | 1 | 1 | 1 | 1 | 1 | 1 | 1 | 0 |
| 255 | | Vr129 | Vr128 | Vr129 | 1 | 1 | 1 | 1 | 1 | 1 | 1 | 1 |
| 256 | Vr129 | | | | | | | | | | | |

FIG. 11A  REFERENCE CASE

| FIGS. 23, 24 | | 8 BITS | 10 BITS |
|---|---|---|---|
| 1ST DECODER | TOURNAMENTS 1, 2 | 126 | 510 |
| | TOURNAMENT 3 | 62 | 254 |
| 2ND DECODER | | 12 | 12 |
| TOTAL | | 326 | 1286 |

FIG. 11B  REFERENCE CASE

| FIGS. 5, 1, 6, 8 | 8 BITS | 10 BITS |
|---|---|---|
| CIRCUIT 11 | 126 | 510 |
| CIRCUIT 13 | 8 | 8 |
| TOTAL | 386 | 1538 |

FIG. 11C  REFERENCE CASE

| FIGS. 5, 2, 7, 8 | 8 BITS | 10 BITS |
|---|---|---|
| CIRCUIT 12 | 94 | 382 |
| CIRCUIT 13 | 8 | 8 |
| TOTAL | 290 | 1154 |

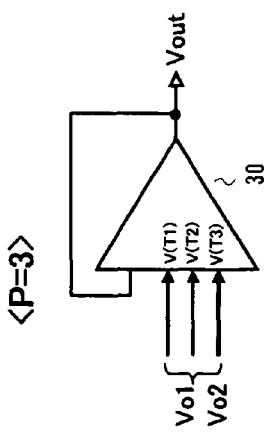

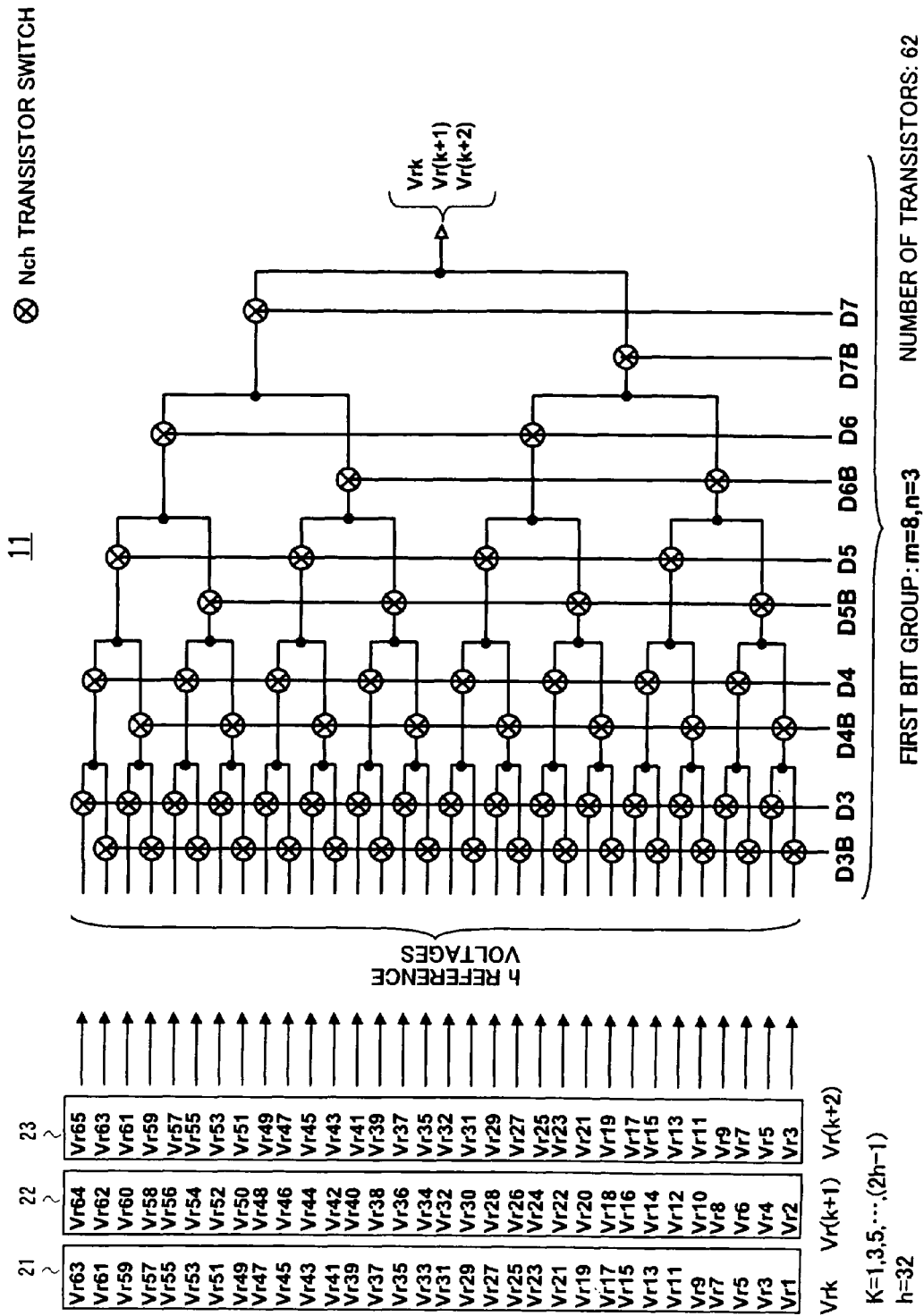

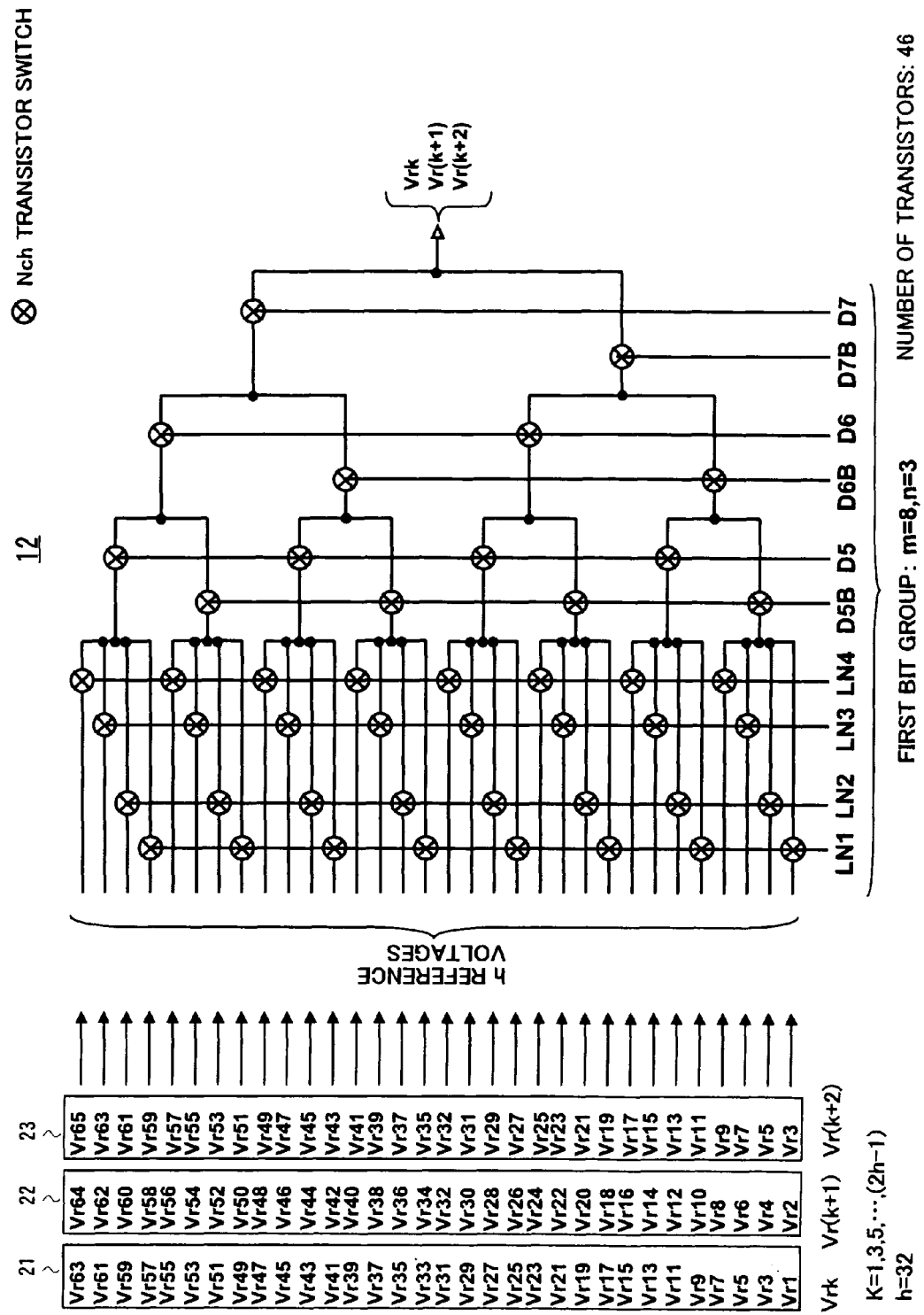

FIG. 17A

EXEMPLARY EMBODIMENT WHERE m=8, n=2, h=62 HOLDS

REFERENCE VOLTAGE VrX (2h+1) VOLTAGES (EXCLUDING VrdX)

| level | Vref | T1 (Vo1) | T2 (Vo2) | D7 | D6 | D5 | D4 | D3 | D2 | D1 | D0 |
|---|---|---|---|---|---|---|---|---|---|---|---|
| 0 | Vrd1 | Vrd1 | Vrd1 | 0 | 0 | 0 | 0 | 0 | 0 | 0 | 0 |
| 1 | | Vrd1 | Vr1 | 0 | 0 | 0 | 0 | 0 | 0 | 0 | 1 |
| 2 | Vrd2 | Vrd2 | Vrd2 | 0 | 0 | 0 | 0 | 0 | 0 | 1 | 0 |
| 3 | | Vrd3 | Vr1 | 0 | 0 | 0 | 0 | 0 | 0 | 1 | 1 |
| 4 | Vrd4 | Vrd4 | Vrd4 | 0 | 0 | 0 | 0 | 0 | 1 | 0 | 0 |
| 5 | | Vr1 | Vr1 | 0 | 0 | 0 | 0 | 0 | 1 | 0 | 1 |
| 6 | | Vr2 | Vr1 | 0 | 0 | 0 | 0 | 0 | 1 | 1 | 0 |
| 7 | | Vr2 | Vr2 | 0 | 0 | 0 | 0 | 0 | 1 | 1 | 1 |
| 8 | | Vr3 | Vr2 | 0 | 0 | 0 | 0 | 1 | 0 | 0 | 0 |
| 9 | | Vr3 | Vr3 | 0 | 0 | 0 | 0 | 1 | 0 | 0 | 1 |
| 10 | | Vr4 | Vr3 | 0 | 0 | 0 | 0 | 1 | 0 | 1 | 0 |
| 11 | | Vr4 | Vr4 | 0 | 0 | 0 | 0 | 1 | 0 | 1 | 1 |
| 12 | | Vr5 | Vr4 | 0 | 0 | 0 | 0 | 1 | 1 | 0 | 0 |
| 13 | | Vr5 | Vr5 | 0 | 0 | 0 | 0 | 1 | 1 | 0 | 1 |
| 14 | | Vr6 | Vr5 | 0 | 0 | 0 | 0 | 1 | 1 | 1 | 0 |
| 15 | | Vr6 | Vr6 | 0 | 0 | 0 | 0 | 1 | 1 | 1 | 1 |
| 16 | | Vr7 | Vr6 | 0 | 0 | 0 | 1 | 0 | 0 | 0 | 0 |
| ... | | | | | | | | | | | |
| 239 | | Vr119 | Vr118 | 1 | 1 | 1 | 0 | 1 | 1 | 1 | 1 |
| 240 | | Vr119 | Vr119 | 1 | 1 | 1 | 1 | 0 | 0 | 0 | 0 |
| 241 | | Vr120 | Vr119 | 1 | 1 | 1 | 1 | 0 | 0 | 0 | 1 |
| 242 | | Vr120 | Vr120 | 1 | 1 | 1 | 1 | 0 | 0 | 1 | 0 |
| 243 | | Vr121 | Vr120 | 1 | 1 | 1 | 1 | 0 | 0 | 1 | 1 |
| 244 | | Vr121 | Vr121 | 1 | 1 | 1 | 1 | 0 | 1 | 0 | 0 |
| 245 | | Vr122 | Vr121 | 1 | 1 | 1 | 1 | 0 | 1 | 0 | 1 |
| 246 | | Vr122 | Vr122 | 1 | 1 | 1 | 1 | 0 | 1 | 1 | 0 |
| 247 | | Vr123 | Vr122 | 1 | 1 | 1 | 1 | 0 | 1 | 1 | 1 |
| 248 | | Vr123 | Vr123 | 1 | 1 | 1 | 1 | 1 | 0 | 0 | 0 |
| 249 | | Vr124 | Vr123 | 1 | 1 | 1 | 1 | 1 | 0 | 0 | 1 |
| 250 | | Vr124 | Vr124 | 1 | 1 | 1 | 1 | 1 | 0 | 1 | 0 |
| 251 | | Vr125 | Vr124 | 1 | 1 | 1 | 1 | 1 | 0 | 1 | 1 |
| 252 | | Vr125 | Vr125 | 1 | 1 | 1 | 1 | 1 | 1 | 0 | 0 |
| 253 | Vrd5 | Vrd5 | Vrd5 | 1 | 1 | 1 | 1 | 1 | 1 | 0 | 1 |
| 254 | Vrd6 | Vrd6 | Vrd6 | 1 | 1 | 1 | 1 | 1 | 1 | 1 | 0 |
| 255 | Vrd7 | Vrd7 | Vrd7 | 1 | 1 | 1 | 1 | 1 | 1 | 1 | 1 |
| 256 | | | | | | | | | | | |

(m-n) BITS / n BITS

FIG. 17B

INTERPOLATING AMPLIFIER 30 WITH TWO (P=2) INPUT TERMINALS

INTERPOLATING AMPLIFIER OUTPUT:
Vout=[V(T1)+V(T2)]/2

DIGITAL-TO-ANALOG CONVERTER CIRCUIT, DATA DRIVER AND DISPLAY DEVICE

REFERENCE TO RELATED APPLICATION

This application is based upon and claims the benefit of the priority of Japanese patent application No. 2007-277710, filed on Oct. 25, 2007, the disclosure of which is incorporated herein in its entirety by reference thereto.

FIELD OF THE INVENTION

This invention relates to a digital-to-analog converter circuit, a data driver having this circuit and a display device having the data driver.

BACKGROUND OF THE INVENTION

Liquid crystal display devices (LCDs) characterized by their thin design, light weight and low power consumption have come into widespread use in recent years and are utilized in the display units of mobile devices such as portable telephones (mobile telephones or cellular telephones), PDAs (Personal Digital Assistants) and note type personal computers. Recently, however, liquid crystal display devices have come to be provided with large-size screens and techniques for dealing with moving pictures have become more advanced, thus making it possible to realize not only mobile applications but also stay-at-home large-screen display devices and large-screen liquid crystal televisions. Liquid crystal display devices that rely upon active matrix drive and are capable of presenting a high-definition display are being utilized as these liquid crystal displays devices.

The principal elements connected to one pixel of a liquid crystal display unit are illustrated schematically by an equivalent circuit diagram in FIG. 21.

In general, a display unit 960 of an active-matrix liquid crystal display device comprises a semiconductor substrate on which transparent pixel electrodes 964 and thin-film transistors (TFTs) 963 are laid out in the form of a matrix (e.g., 1280×3 pixel columns×1024 pixels rows in the case of a color SXGA panel); an opposing substrate on the entire surface of which a single transparent electrode 967 is formed; and a liquid crystal material sealed between these two substrates arranged to oppose each other. The liquid crystal has capacitance and forms a capacitor 965 between the pixel electrode 964 and the electrode 967. Often an auxiliary capacitor 966 for assisting the capacitance of the liquid crystal is provided.

In this liquid crystal display device, the TFT 963, which has a switching function, is turned on and off under the control of a scan signal. When the TFT 963 is on, a gray-scale signal voltage that corresponds to a video data signal is applied to the pixel electrode 964, and the transmittance of the liquid crystal changes owing to a potential difference between each pixel electrode 964 and opposing-substrate electrode 967. This potential difference is held for a fixed period of time by the liquid-crystal capacitor 965 and auxiliary capacitor 966 even after the TFT 963 is turned off, as a result of which an image is displayed.

A data line 962 that sends a plurality of level voltages (gray-scale signal voltages) applied to each pixel electrode 964 and a scan line 961 that sends the scan signal are wired on the semiconductor substrate in the form of a grid. The data lines are 1280×3 in number and the scan lines are 1024 in number in the case of the above-mentioned color SXGA panel. The scan line 961 and data line 962 constitute a large capacitive load owing to the capacitance produced at the intersection of these lines and capacitance of the liquid crystal sandwiched between the opposing-substrate electrodes.

It should be noted that the scan signal is supplied to the scan line 961 from a gate driver 970, and that the supply of gray-scale signal voltage to each pixel electrode 964 is performed by a data driver 980 via the data line 962. Further, the gate driver 970 and data driver 980 are controlled by a display controller 950, a required clock CLK and control signals are supplied from the display controller 950, and video data is supplied to the data driver 980. At the present time, video data is principally digital data. A power-supply circuit 940 supplies driving power to the gate driver 970 and data driver 980.

Rewriting of one screen of data is carried out over one frame (1/60 of a second), data is selected successively every pixel row, that is, every line, by each scan line, and a gray-scale signal voltage is supplied from each data line within the selection interval.

Although the gate driver 970 need only supply at least a binary scan signal, it is required that the data driver 980 drive the data lines by gray-scale signal voltages of multiple levels that conform to the number of gray levels. To this end, the data driver 980 has a digital-to-analog converter (DAC) comprising a decoder for converting video data to a gray-scale signal voltage and an operational amplifier for amplifying the gray-scale signal voltage and outputting the amplified signal to the data line 962.

Progress has been made in raising image quality (increasing the number of colors) in portable telephone terminals, note-type personal computers and liquid crystal TVs, etc. However, there is now growing demand for video data of six bits per each of the colors R, G, B (260,000 colors) and preferably 8-bit video data (26,800,000 colors) or higher.

For this reason, a data driver that outputs a gray-scale signal voltage corresponding to multiple-bit video data is now required to output multiple gray-scale voltages and, in addition, to produce highly accurate voltage outputs corresponding to gray-scales. If reference voltages generated in correspondence with multiple gray-scale voltages are increased, the number of elements in a reference voltage generating circuit and the number of elements of switching transistors in the decoder circuit that selects reference voltages corresponding to input video signals are increased.

Patent Document 1 proposes a technique for reducing number of reference voltages and number of switching transistors by utilizing interpolation. FIG. 23 is a diagram illustrating the configuration of a selecting circuit in a digital-to-analog converter circuit of a data driver disclosed in Patent Document 1 (FIG. 10). This arrangement uses an output amplifier circuit (interpolation amplifier) having two inputs (the amplifier is not shown). The interpolation amplifier receives OUT1 (Vn) and OUT2 (Vn+2) as inputs and produces voltages obtained by internally dividing these two inputs at a ratio of 1:1. An 8-bit input signal is divided into six bits and three bits (with one bit being overlapped) and tournament-type decoders (tournaments 1, 2, 3) are used as decoders for decoding the 6-bit signal. With regard to 8-bit display data, an input gray level of six bits (D0P, D0N, D1P, D1N, D2P, D2N, D3P, D3N, D4P, D4N, D5P, D5N) are divided into the three blocks (A, B, C) mentioned below.

Specifically, V(0), V(8), . . . V(0+8n), . . . V(248), V(256) are decoded by tournament 1; V(2), V(6), . . . V(2+4n), . . . V(250), V(254) are decoded by tournament 2; and V(4), V(4+8n), . . . V(252) are decoded by tournament 3.

A 6-bit-input first decoder (1st decoder) is constructed by tournament 1, tournament 2 and tournament 3.

Outputs VA, VB and VC of the 1st decoder are supplied to a 2-bit (D6P, D6N, D7P, D7N) second decoder (2nd decoder) through a 1-bit selecting circuit to which changeover signals D0N and D0P are applied, and two outputs OUT1(Vn), OUT2(Vn+2) are obtained. The changeover signals D0N and D0P are applied to both the 1st decoder and the 2nd decoder.

The selecting circuit selects one output from among the outputs VA, VB and VC of tournaments 1, 2 and 3, respectively, and supplies it to the 2nd decoder.

The two outputs OUT1(Vn) and OUT2(Vn+2) of the 2nd decoder are supplied to the 2-input output amplifier circuit (interpolation amplifier) (not shown).

This circuit approximately halves the number of reference voltages (gray-scale voltages) using an interpolation amplifier.

FIG. 24A is a diagram illustrating the configuration of tournament 1 shown in FIG. 23, and FIG. 24B is a diagram illustrating the configuration of tournament 3. As shown in FIG. 24A, gray-scale voltages 0+8n (V00, V08, V16, . . . V248, V256) are supplied to tournament 1, which proceeds to decode 6-bit display data (D0P, D0N, D1P, D1N, D2P, D2N, D3P, D3N, D4P, D4N, DSP, D5N) and obtain output VA. Gray-level voltages 2+4n (2, 6, 10, 14, . . . 250, 254) are supplied to tournament 2, which proceeds to decode 6-bit display data (D0P, D0N, D1P, D1N, D2P, D2N, D3P, D3N, D4P, D4N, DSP, D5N) and obtain output VB. Gray-level voltages 4+8n (V04, V12, V20, . . . V244, V252) are supplied to tournament 3, which proceeds to decode 5-bit display data (D1P, D1N, D2P, D2N, D3P, D3N, D4P, D4N, DSP, D5N) and obtain output VC.

In order to prevent deterioration of the liquid crystal, the data driver usually performs AC drive so as to apply positive and negative voltages alternatingly as the voltage VCOM of the opposing substrate electrode in the liquid crystal cell. To achieve this, positive-drive and negative-drive gray-scale voltage signals are output. FIG. 22A is a diagram illustrating the relationship between applied voltage and transmittance in normally white liquid crystal, and FIG. 22B is a diagram illustrating the relationship between gray levels of a liquid crystal display device for driving liquid crystal having the characteristic of FIG. 22A and output voltage of a data driver (voltage applied to the liquid crystal). When the voltage applied to the liquid crystal is at its highest at gray level 0 in FIG. 22B, transmittance is at its lowest (the display is black). As the gray level rises, the voltage applied to the liquid crystal falls, transmittance rises and the display approaches a white display. The relationship between the voltage applied to the liquid crystal and transmittance and the relationship between gray level and the output voltage of the data driver are non-linear characteristics, as illustrated in FIGS. 22A and 22B. The output voltage of the data driver at the time of positive drive ranges from VCOM, which corresponds to gray level 255 (eight bits), to high-potential power supply voltage VDD, which corresponds to gray level 0. At the time of negative drive, the output voltage of the data driver ranges from VCOM corresponding to gray level 255 to low-potential power supply voltage (negative power supply voltage) VSS corresponding to gray level 0.

[Patent Document 1] Japanese Patent Kokai Publication No. JP-P2001-034234A

[Patent Document 2] Japanese Patent Kokai Publication No. JP-P2000-183747A

[Patent Document 3] Japanese Patent Kokai Publication No. JP-P2002-043944A

SUMMARY OF THE DISCLOSURE

The following analysis is given by the present invention.

With the growing popularity of liquid crystal TVs, greater numbers of gray levels are being used (represented by eight to ten bits or more) and a corresponding increase in the area of the decoding circuitry has led to a rise in the cost of the driver.

As illustrated in FIG. 23 and FIGS. 24A, 24B, the arrangement of the digital-to-analog converter circuit of the data driver disclosed in Patent Document 1 is such that the number of reference voltages necessary is halved and the number of switches reduced. Tournament 1 receives 33 reference voltages of V(0+8n) (n=0, 1, . . . , 32) as inputs and decodes six bits, tournament 2 receives 64 reference voltages of V(2+4n) (n=0, 1, . . . , 63) as inputs and decodes six bits, and tournament 3 receives 32 reference voltages of V(4+8n) (n=0, 1, . . . , 31) as inputs and decodes five bits. The configurations of tournaments 1 and 2 differ from each other. Further, a limitation is imposed on the tournaments, namely that reference-voltage combinations [V(0+8n), V(4+8n)] that are a factor of eight are supplied to tournaments 1, 3 and reference-voltage combinations [V(2+4n)] that are a factor of four are supplied to tournament 2. Accordingly, if the configurations of tournaments 1, 2 and tournament 3 depart from combinations that are multiples of eight and combinations that are multiples of four, then the tournaments must have different configurations. A multiple-bit DAC in such case will have circuitry that is complicated.

In the paths leading from tournaments 1, 2 to OUT1 (Vn) or OUT2 (Vn+2) via VA, VB, nine switches are inserted in series with respect to the 8-bit input. If the number of switches connected in series increases, ON resistance of the switches will no longer be negligible. Although the ON resistances of the switches differ owing to the selected reference voltages, the effect upon image quality cannot be ignored if the differences between the ON resistances is large. Further, if the switch is enlarged in dimension in order to reduce the ON resistance of the switch, a problem that arises is an increase in the area of the decoder.

Accordingly, an object of the present invention is to provide a digital-to-analog converter circuit in which an increase in number of reference voltages is suppressed in regard to an increase in number of bits of an input digital signal, and in which an increase in ON resistance of switches is suppressed while a high resolution is achieved.

Another object of the present invention a data driver adapted to suppress an increase in number of reference voltages with regard to an increase in number of bits, enable a reduction in area (cost) and improve image quality.

A further object of the present invention is to provide a display device which, by employing the above-described data driver, improves image quality an makes it possible to reduce power consumption and to lower cost.

The above and other objects are attained by the configuration set forth below.

According to the present invention, there is provided a digital-to-analog converter circuit comprising:

a first reference voltage group including a prescribed number of reference voltages in which a predetermined first voltage is at one end of a range of voltages and mutually adjacent reference voltages are spaced apart from each other by 2×(a unit voltage);

a second reference voltage group including a prescribed number of reference voltages in which a voltage spaced apart from the first voltage by the unit voltage is at one end of a range of voltages and mutually adjacent reference voltages are spaced apart from each other by 2×(the unit voltage);

a third reference voltage group including a prescribed number of reference voltages in which a voltage spaced apart from the first voltage by 2×(the unit voltage) is at one end of a range of voltages and mutually adjacent reference voltages are spaced apart from each other by 2×(the unit voltage);

a first selecting circuit that selects a reference voltage located at an ordinal position, which is designated by an input digital signal, from the one end of the voltage range of the first reference voltage group;

a second selecting circuit that selects a reference voltage located at an ordinal position, which is designated by the input digital signal, from the one end of the voltage range of the second reference voltage group;

a third selecting circuit that selects a reference voltage located at an ordinal position, which is designated by the input digital signal, from the one end of the voltage range of the third reference voltage group;

a fourth selecting circuit that receives the voltages selected by respective ones of the first to third selecting circuits, selects two voltages inclusive of selecting the same voltage redundantly, and outputs the selected two voltages; and an operational circuit that receives the two voltages selected by the fourth selecting circuit and outputs result of a prescribed operation applied to the two voltages; and the reference voltages selected by the first to third selecting circuits are spaced part from each other by the unit voltage.

In the digital-to-analog converter circuit according to the present invention, there is provided first to third reference voltage groups into which first to (2×h+1)th reference voltages are grouped, where h is a prescribed positive integer.

The first reference voltage group including h-number of (2×j−1)th reference voltages, wherein j is a prescribed positive integer of 1 to h. The second reference voltage group including h-number of (2×j)th reference voltages, The third reference voltage group including h-number of (2×j+1)th reference voltages. Also provided a first selecting circuit that receives the first reference voltage group and selects a first reference voltage based upon an input digital signal supplied thereto; a second selecting circuit that receives the second reference voltage group and selects a second reference voltage based upon the input digital signal supplied thereto; a third selecting circuit that receives the third reference voltage group and selects a third reference voltage based upon the input digital signal supplied thereto; a fourth selecting circuit that receives the reference voltages selected by respective ones of the first to third selecting circuits, selects two of the reference voltages, inclusive of selecting the same voltage redundantly, based upon an input digital signal supplied thereto, and outputs the selected two reference voltages; and an amplifier circuit that receives the two reference voltages selected by the fourth selecting circuit and outputs a result of an operation applied to the two reference voltage.

In the present invention, prescribed higher order bits that include a most significant bit (MSB) of the input digital signal are supplied to the first to third selecting circuits, and prescribed lower order bits that include a least significant bit (LSB) of the input digital signal are supplied to the fourth selecting circuit. In the present invention, the prescribed higher order bits and prescribed lower order bits do not include bits that are duplicates of each other.

In the present invention, the circuit further comprises a predecoder for receiving as an input and decoding a prescribed bit field of the prescribed higher order bits of the input digital signal; wherein a signal output from the predecoder and a bit signal of the prescribed higher order bits of the input digital signal, with the exception of the prescribed bit field, are supplied to the first to third selecting circuits.

In the present invention, the amplifier circuit outputs a voltage obtained by interpolating it from the two reference voltages that have been selected by the fourth selecting circuit (inclusive of the same voltage selected redundantly). In a case where the two reference voltages that have been selected by the fourth selecting circuit are the same (redundant), the amplifier circuit outputs a reference voltage identical with these two reference voltages that are the same.

In the present invention, the amplifier circuit receives the two reference voltages, which have been selected by the fourth selecting circuit, at least at two input terminals, and outputs a voltage obtained by interpolating it from the voltages at the first and second input terminals. In a case where the two reference voltages that have been selected by the fourth selecting circuit are the same (redundant), the amplifier circuit outputs a reference voltage identical with these two reference voltages that are the same.

In the present invention, the amplifying circuit receives the two reference voltages, which have been selected by the fourth selecting circuit (inclusive of the same voltage selected redundantly), at first, second and third input terminals, and outputs a voltage obtained by weighting the voltages at the first, second and third input terminals by prescribed coefficients. In a case where the two reference voltages that have been selected by the fourth selecting circuit are the same (redundant), the amplifier circuit outputs a reference voltage identical with these two reference voltages that are the same.

In the present invention, a reference voltage group of a first range of voltages different from a voltage range of the first to (2×h+1)th reference voltages is provided; and the circuit further comprises a fifth selecting circuit for receiving the reference voltage group of the first range of voltages as an input and selecting two reference voltages in accordance with the input digital signal. In the present invention, a reference voltage group of a second range of voltages different from the voltage range of the first to (2×h+1)th reference voltages and different from the first range of voltages is provided; and the circuit further comprises a sixth selecting circuit for receiving the reference voltage group of the second range of voltages as an input and selecting two reference voltages in accordance with the input digital signal.

In the present invention, with respect to the first to (2×h+1)th reference voltages, voltages of 4×h levels are output in correspondence with values of the input digital signal.

In the present invention, with respect to the first to (2×h+1)th reference voltages, voltages of 8×h levels are output in correspondence with values of the input digital signal.

In the present invention, if h satisfies the relation $2^{(m-1)} < h \leq 2^m$, then higher order m bits of the input digital signal are supplied to the first to third selecting circuits, and one reference voltage among the h-number of reference voltages is selected.

In the present invention, the fourth selecting circuit selects the two reference voltages (inclusive of selecting the same voltage redundantly) from among the three reference voltages, which have been selected by the first to third selecting circuits, by the lower order two bits of the input digital signal, and the fourth selecting circuit outputs the two reference voltages to two output nodes.

In the present invention, the fourth selecting circuit selects the two reference voltages (inclusive of selecting the same voltage redundantly) from among the three reference voltages, which have been selected by the first to third selecting circuits, by the lower order three bits of the input digital signal, and the fourth selecting circuit outputs the two reference voltages to three output nodes.

In accordance with the present invention, there is provided a data driver having a digital-to-analog converter circuit, which is in accordance with the present invention, for receiving an input digital signal conforming to an input video signal and outputting a voltage conforming to the input digital signal.

In accordance with the present invention, there is provided a display device having unit pixels, each of which includes a pixel switch and a display element, provided at intersections of data lines and scan lines, wherein signals on the data lines are written to the display elements via pixel switches that have been turned on by the scan lines; the display device having the above-described data driver as a data driver for driving the data lines.

In accordance with the present invention, there is provided a display device comprising: a plurality of data lines extending in parallel with one another along a first direction; a plurality of scan lines extending in parallel with one another in a direction perpendicular to the first direction; a plurality of pixel electrodes arranged in matrix form at intersections of the plurality of data lines and the plurality of scan lines; a plurality of transistors corresponding to respective ones of the plurality of pixel electrodes, each transistor having a drain and a source one of which is connected to the corresponding pixel electrode and the other of which is connected to a corresponding data line, and a gate connected to a corresponding scan line; a gate driver for supplying scan signals to respective ones of the plurality of scan lines; and a data driver for supplying gray-scale signals, which correspond to input data, to respective ones of the plurality of data lines; the data driver comprising the above-described data driver.

In accordance with the digital-to-analog converter circuit of the present invention, an increase in number of reference voltages can be suppressed in case of the number of bits of the digital-to-analog converter circuit being increased.

Further, in accordance with the data driver of the present invention, it is possible to suppress an increase in number of reference voltages with regard to an increase in number of bits of the video data, thereby enabling a reduction in area (cost) and an improvement in image quality.

Further, in accordance with the display device of the present invention, image quality is improved and it is possible to reduce power consumption and cost by using the above-described data driver.

Still other features and advantages of the present invention will become readily apparent to those skilled in this art from the following detailed description in conjunction with the accompanying drawings wherein only the preferred embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

BRIEF DESCRIPTIONS OF THE DRAWINGS

FIG. 5A is a diagram useful in describing a concrete example of FIG. 1 or FIG. 2, and FIG. 5B is a diagram useful in describing an amplifying circuit;

FIGS. 11A, 11B and 11C are diagrams exemplifying number of switches in a comparison example (FIG. 23) and in the exemplary embodiments of FIGS. 1 and 2;

FIG. 12A is a diagram useful in describing another concrete example of FIG. 1 or FIG. 2, and FIG. 12B is a diagram useful in describing an amplifying circuit;

FIG. 13 is a diagram illustrating the configuration of the subdecoder 11 of FIG. 1 in the concrete example of FIG. 12;

FIG. 14 is a diagram illustrating the configuration of the subdecoder 12 in the concrete example of FIG. 12;

FIG. 17A is a diagram useful in describing another concrete example of FIG. 1 or FIG. 2, and FIG. 17B is a diagram useful in describing an amplifying circuit;

PREFERRED MODES OF THE INVENTION

Figure 1:
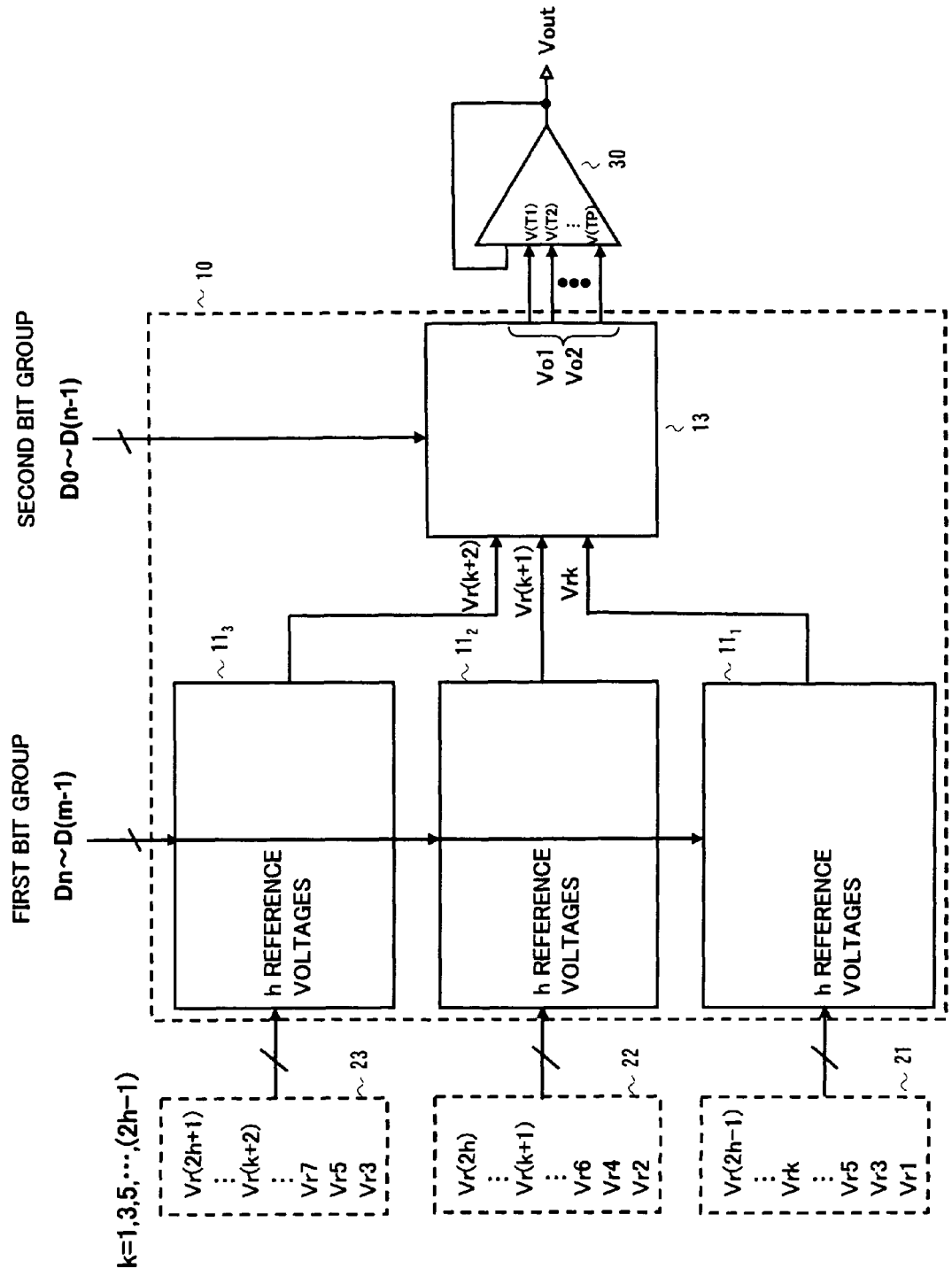
FIG. 1 is a diagram illustrating the configuration of an exemplary embodiment of the present invention.

The present invention will now be described in detail with reference to the accompanying drawings, in which FIG. 1 is a diagram illustrating the configuration of a digital-to-analog converter circuit (DAC) of an exemplary embodiment of the present invention. Although it does not impose any particular limitation on the present invention, the digital-to-analog converter circuit shown in FIG. 1 in combination with an amplifying circuit is suited for application to a data driver for driving data lines of a liquid crystal panel or the like.

As shown in FIG. 1, a digital-to-analog converter circuit according to this exemplary embodiment receives first to $(2 \times h+1)$th (where h is a prescribed positive integer) reference voltages Vr1 to Vr($2 \times h+1$), where Vr1<Vr2, . . . <Vr(2h)<Vr(2h+1) holds, which are output from a reference voltage generating circuit (not shown). These reference voltages are grouped into a first reference voltage group 21 comprising h-number of ($2 \times j-1$)th (where j is a prescribed positive integer of 1 to h) reference voltages; a second reference voltage group 22 comprising h-number of ($2 \times j$)th reference voltages; and a third reference voltage group 23 comprising h-number of ($2 \times j+1$)th reference voltages. The digital-to-analog converter circuit includes a decoder 10, which selects reference voltages based upon the input digital signal, and an amplifying circuit 30. The first to ($2 \times h+1$)th reference voltages Vr1 to Vr($2 \times h+1$) are output from a reference voltage generating circuit 20 (FIG. 20), described later.

The decoder 10 includes:

(a) a first subdecoder (corresponding to a first selecting circuit in claims) 11$_1$ that receives h-number of reference voltages Vr1, Vr3, . . . , Vrk, . . . , and Vr(2h−1) of the first reference voltage group 21 and selects one reference voltage Vrk based upon a first bit group [Dn to D(m−1)] of the input digital signal;

(b) a second subdecoder (corresponding to a second selecting circuit in claims ) 11$_2$ that receives h-number of reference voltages Vr2, Vr4, . . . , Vr(k+1), , and Vr(2h) of the second reference voltage group 22 and selects one reference voltage Vr(k+1) based upon the first bit group [Dn to D(m−1)] of the input digital signal;

(c) a third subdecoder (corresponding to a third selecting circuit in claims) 11$_3$ that receives the h-number of reference voltages Vr3, Vr5, . . . , Vr(k+2), . . . , and Vr(2h+1) of the third reference voltage group 23 and selects one reference voltage Vr(k+2) based upon the first bit group [Dn to D(m−1)] of the input digital signal; and (d) a fourth subdecoder (corresponding to a fourth selecting circuit in claims) 13 that receives the reference voltages Vrk, Vr(k+1), and Vr(k+2) selected by the first, second and third subdecoders 11$_1$, 11$_2$, and 11$_3$, respectively, selects at least two of these reference voltages (inclusive of selecting the same voltage redundantly) as Vo1 and Vo2 based upon a second bit group [D0 to D(n−1)] of the input digital signal, and outputs the selected voltages.

In this exemplary embodiment, with regard to the (2h+1) reference voltages Vr1, Vr2, Vr3, . . . , Vr(2h), and Vr(2h+1) and their division into the first to third reference voltage groups 21, 22 and 23, jth (j=1 to h) reference voltages Vr(2j−1) and Vr(2j+1) of the first and third reference voltage groups 21 and 23, respectively, are shifted from each other by an interval (potential difference) of two reference voltages, and the jth reference voltage V(2j) of the second reference voltage group 22 is made the reference voltage that is intermediate the jth reference voltages Vr(2j−1) and Vr(2j+1) of the first and third reference voltage groups 21 and 23, respectively.

In this exemplary embodiment, the first to third subdecoders 11$_1$ to 11$_3$ are of the identical configuration (there are instances where the subscripts are eliminated and the subdecoders are referred to merely by reference numeral 11 in the specification and attached drawings) and each selects one reference voltage from a respective one of the first to third reference voltage groups 21 to 23 in accordance with the values of the first bit group Dn to D(m−1) (where 0<n<m−1 holds) forming part of the m-bit input digital signal.

When a jth ($1 \leq j \leq h$) reference voltage Vr(2j−1) of the first reference voltage group 21 is selected by the first subdecoder 11$_1$ in accordance with the values of the bit string of the first bit group Dn to D(m−1), jth reference voltages Vr(2j) and Vr(2j+1) of the second and third reference voltage groups 22 and 23, respectively, are selected by the second and third subdecoders 11$_2$ and 11$_3$, respectively. If k=2j−1 holds, then the first, second and third subdecoders 11$_1$, 11$_2$ and 11$_3$ select and output three neighboring reference voltages Vrk, Vr(k+1) and Vr(k+2), respectively, as illustrated in FIG. 1.

In accordance with the second bit group D0 to D(n−1) [where D0 is the LSB (least significant bit)] constituting the lower order bits of the m-bit input digital signal, the fourth subdecoder 13 selects two identical or neighboring reference voltages Vo1 and Vo2 from among the three reference voltages Vrk, Vr(k+1) and Vr(k+2) selected by the first, second and third subdecoders 11$_1$, 11$_2$ and 11$_3$, respectively, and produces these to P-number (where P is a prescribed integer equal to or greater than 2) of input terminals T1, . . . , and TP of the amplifying circuit 30.

The fourth subdecoder 13 which receives the three neighboring reference voltages Vrk, Vr(k+1) and Vr(k+2) as inputs selects and outputs one pair of reference voltages as the two voltages (Vo1, Vo2), namely one pair of reference voltages from among identical reference voltage pairs (Vrk, Vrk), [Vr(k+1), Vr(k+1)], [Vr(k+2), Vr(k+2)] and mutually adjacent reference voltage pairs [Vrk, Vr(k+1)], [Vr(k+1), Vrk], [Vr(k+1), Vr(k+2)], [Vr(k+2), Vr(k+1)].

The amplifying circuit 30 receives the voltages Vo1 and Vo2 output from the fourth subdecoder 13 at input terminals T1 to TP to which inclusive of identical signals may be supplied, and outputs a prescribed operation result (combined voltage) in relation of the voltages applied to the input terminals T1 to TP. In this exemplary embodiment, the amplifying circuit 30 comprises an interpolation amplifier.

In this exemplary embodiment, the amplifying circuit (interpolation amplifier) 30 are supplied with mutually adjacent reference voltages or identical reference voltages at terminals T1 to TP as Vo1 and Vo2. The amplifying circuit 30 is capable of generating a plurality of levels (e.g., four levels, as will be described later) obtained by internally dividing the potential difference between the mutually adjacent reference voltages into two or more levels. The interpolation amplifier may be constructed by any operational amplifier circuit that is configured to perform weighted addition of the voltages received at the plurality of input terminals thereof.

Figure 2:
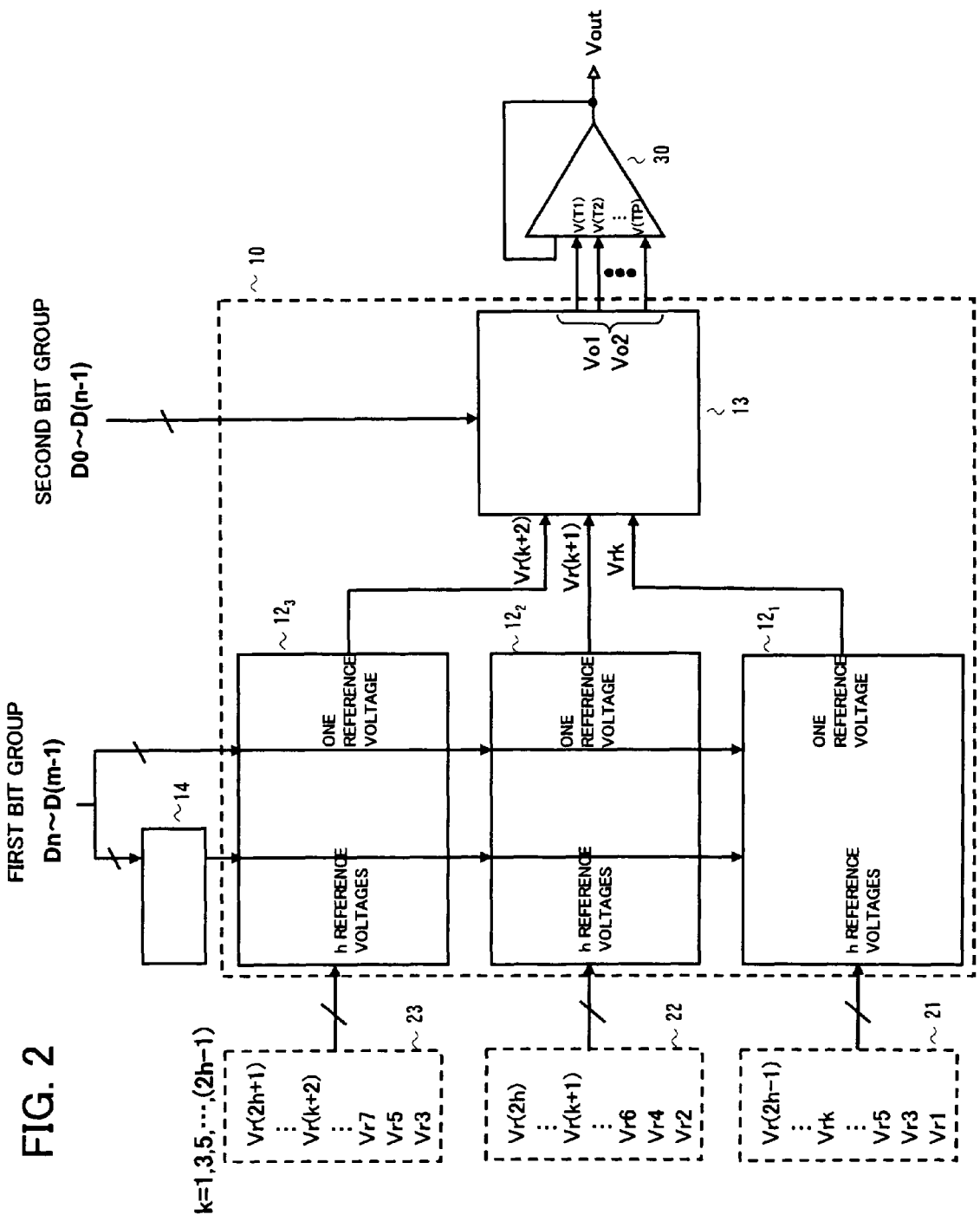
FIG. 2 is a diagram illustrating the configuration of another exemplary embodiment of the present invention.

FIG. 2 is a diagram illustrating the configuration of a second exemplary embodiment of the present invention. In the second exemplary embodiment, as shown in FIG. 2, a bit signal which is part of the bits of the first bit group Dn to D(m−1) of FIG. 1 is pre-decoded by a predecoder circuit 14 and is then input to the subdecoders 11$_1$ to 11$_3$.

By adopting an arrangement in which a signal that is part of the first bit group is pre-decoded and then input to the subdecoders 11$_1$ to 11$_3$, this exemplary embodiment reduces the number of switching transistors of the subdecoders 11$_1$ to 11$_3$ in comparison with the first exemplary embodiment shown in FIG. 1. Components in FIG. 2 identical with those shown in FIG. 1 are designated by like reference characters.

In FIG. 2, the first, second and third subdecoders 12$_1$, 12$_2$ and 12$_3$ are identically constructed (there are instances where the subscripts are eliminated and the subdecoders are referred to merely by reference numeral 12 in the specification and attached drawings), receive as inputs the pre-decoded signal, which has been obtained by pre-decoding prescribed bits of the first bit group Dn to D(m−1) by the predecoder 14, and the bit signal composed of the remaining bits of the first bit group Dn to D(m−1), and each selects one of the h-number of reference voltages from the respective one of the first, second and third reference voltage groups 21, 22, and 23.

Reference voltages Vrk, Vr(k+1), and Vr(k+2) selected and output by the first, second and third subdecoders 12$_1$, 12$_2$, and $12_3$ are supplied to the fourth subdecoder 13. In a manner similar to that of the first exemplary embodiment, the fourth subdecoder 13 supplies the two output signals Vo1 and Vo2, which may be identical, to the plurality of input terminals T1 to TP of the amplifying circuit 30. The amplifying circuit 30 comprises an interpolation amplifier similar to that of the first exemplary embodiment shown in FIG. 1.

Figures 3A, 3B:
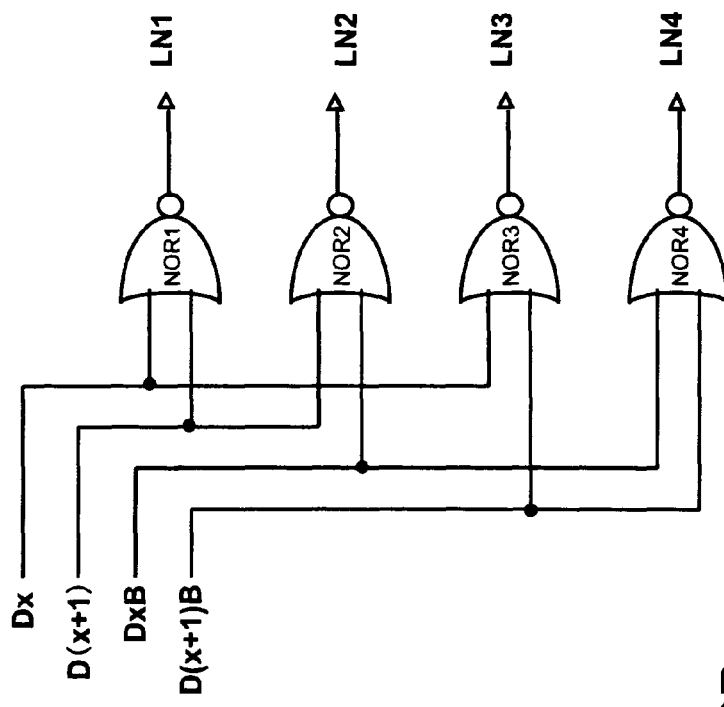
FIGS. 3A and 3B are diagrams illustrating an example of the configuration of a predecoder 14 in FIG. 2.

FIG. 3A is a diagram illustrating an example of the configuration of the predecoder 14 of FIG. 2, and FIG. 3B is a truth table illustrating the operation of the circuit shown in FIG. 3A. The predecoder 14 depicted in FIG. 3A receives and decodes two bits D(x+1), Dx from the first bit group Dn to D(m−1) to produce signals LN1, LN2, LN3 and LN4. It should be noted that FIG. 3A illustrates the circuit arrangement in a case where the circuit is composed of Nch transistors. In the present specification, DxB represents a signal that is the inverse (complement) of Dx.

With reference to FIG. 3A, the predecoder 14 includes a NOR gate NOR1 for receiving Dx (which corresponds to Dn in FIG. 2) and D(x+1), which is one bit higher in order, as inputs and outputting LN1; a NOR gate NOR2 for receiving D(x+1) and DxB (a signal that is the complement of Dx) as inputs and outputting LN2; a NOR gate NOR3 for receiving Dx and D(x+1)B as inputs and outputting LN3; and a NOR gate NOR4 for receiving DxB and D(x+1)B as inputs and outputting LN4. In accordance with [D(x+1), Dx]=(Low, Low), (Low,High), (High,Low), (High,High), LN1, LN2, LN3 and LN4, respectively, are placed at the high level. In each of the subdecoders 12 (composed of Nch transistors) that receive the signals LN1, LN2, LN3 and LN4 that have been decoded by the predecoder 14, the Nch transistor switches whose gates are connected to the high signal among LN1, LN2, LN3 and LN4 are turned on.

Figures 4A, 4B:
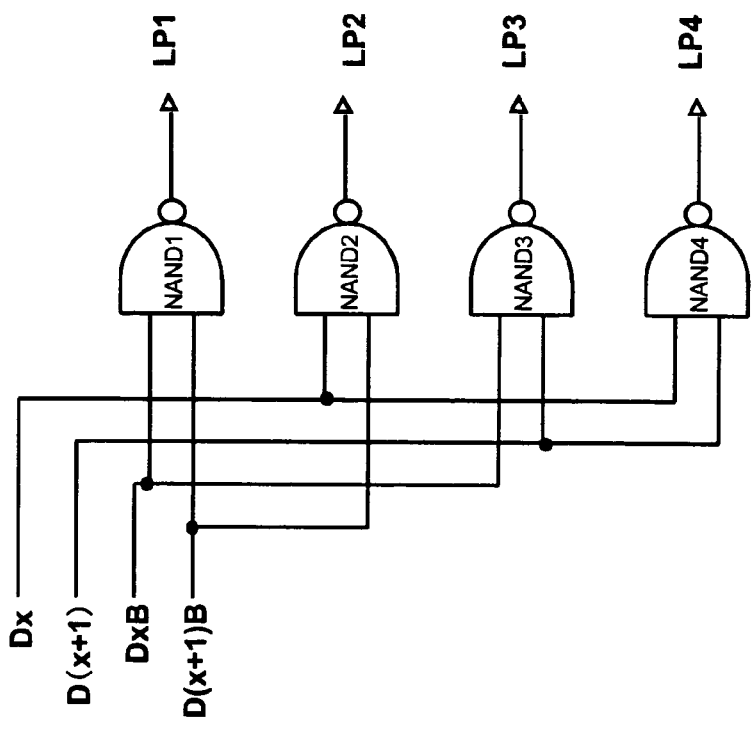
FIGS. 4A and 4B are diagrams illustrating another example of the configuration of the predecoder 14 in FIG. 2.

FIG. 4A is a diagram illustrating another example of the configuration of the predecoder 14 of FIG. 2. In this case the predecoder 14 is composed of Pch transistors. FIG. 4B is a truth table illustrating the operation of the circuit shown in FIG. 4A. The example of the predecoder 14 shown in FIG. 4A receives the two bits of D(x+1), Dx from the first bit group Dn to D(m−1) as inputs and outputs four bits LP1, LP2, LP3 and LP4.

With reference to FIG. 4A, the predecoder 14 includes a NAND gate NAND1 for receiving the complementary signal DxB of Dx and the complementary signal D(x+1)B of D(x+1), which is one bit higher in order, as inputs and outputting LP1; a NAND gate NAND2 for receiving Dx and D(x+1)B, as inputs and outputting LP2; a NAND gate NAND3 for receiving Dx and D(x+1) as inputs and outputting LP3; and a NOR gate NOR4 for receiving DxB and D(x+1) as inputs and outputting LP4. In accordance with [D(x+1), Dx]=(Low, Low), (Low,High), (High,Low), (High,High), LP1, LP2, LP3 and LP4, respectively, are placed at the LOW level. In each of the subdecoders 12 (composed of Pch transistors) that receive the signals LP1, LP2, LP3 and LP4 that have been decoded by the predecoder 14, the Pch transistor switches whose gates are connected to the LOW signal among LP1, LP2, LP3 and LP4 are turned on.

FIG. 5A is a diagram in which a concrete example of operating specifications is shown collectively in a table format in relation to the exemplary embodiment described above with reference to FIG. 1 or 2. FIG. 5B illustrates the amplifying circuit (interpolation amplifier) 30 of FIG. 1 or 2. In the example of FIGS. 5A, 5B, it is assumed that m=8, n=2 and h=64 (=$2^6$) holds, so that 2h+1=2×64+1=129.

In FIG. 5A, the "level" column (0 to 255) shows the output voltage levels of the amplifying circuit (interpolation amplifier) 30. It is possible to output 256 levels of 0 to 255 in accordance with the 8-bit digital input signal applied to the decoder 10.

Further, "Vref" in FIG. 5A indicates the correspondence between levels and reference voltages. For example, the first reference voltage Vr1 of the first reference voltage group 21 in FIG. 1 or 2 corresponds to level 0, the first reference voltage Vr2 of the second reference voltage group 22 in FIG. 1 or 2 corresponds to level 2, and the first reference voltage Vr3 (which is the second reference voltage of the first reference voltage group 21) of the third reference voltage group 23 in FIG. 1 or 2 corresponds to level 4.

Further, "T1" and "T2" stand for the two input terminals of the amplifying circuit (interpolation amplifier) 30. With reference to FIG. 5B, the amplifying circuit (interpolation amplifier) 30 is of voltage-follower configuration in which Vo1 and Vo2 are connected to two non-inverting input terminals T1 and T2 [voltage V(T1) and V(T2)], respectively, and the output end of which is connected to an inverting input terminal. Output terminal voltage Vout is given by Vout=[V(T1)+V(T2)]/2.

Further, D7-D2 in FIG. 5A correspond to D(m−1)–Dn in FIG. 1 or 2 and are the higher order 8−2=6 bits, and D1, D0 in FIG. 5A correspond to D(n−1)–D0 in FIG. 1 or 2 and are the two lower order bits.

As illustrated in FIG. 5(A), two mutually adjacent reference voltages are assigned to a section comprising four consecutive levels, the level at the end of one section (namely the fourth level from the lower order side) shares the one reference voltage having the lowest level in the adjacent section, and 129 (=2×h+1=2×64+1) reference voltages are assigned to the total of 256 voltage levels of levels 0 to 255.

More specifically, as shown in FIG. 5A, reference voltages Vr1, Vr2 are assigned to the section (first section) of levels 0 to 3. Level 3 at the end of the first section is generated by interpolating it from the lowest-level reference voltage Vr3, which belongs to the adjacent second section (levels 4 to 7), and the reference voltage Vr2 of the first section. Accordingly, with respect to levels 0 to 3, three reference voltages (Vr1, Vr2, Vr3) are selected by the first, second and third subdecoders $11_1$, $11_2$, $11_3$ based upon the first bit group (D7 to D2), these reference voltages are supplied to the fourth subdecoder 13 and the fourth subdecoder 13 selects two of these reference voltages (inclusive of selecting the same one redundantly) based upon the second bit group (D1,D0).

More specifically, when (D1,D0)=(0,0) holds, the fourth subdecoder 13 selects (Vo1, Vo2)=[V(T1), V(T2)]=(Vr1, Vr1), and the amplifying circuit (interpolation amplifier) 30 outputs Vout=(Vr1+Vr1)/2=Vr1.

When (D1,D0)=(0,1) holds, the fourth subdecoder 13 selects (Vo1, Vo2)=[V(T1), V(T2)]=(Vr2, Vr1), and the amplifying circuit (interpolation amplifier) 30 outputs the level that is intermediate Vr1 and Vr2, namely Vout=(Vr2+Vr1)/2.

When (D1,D0)=(1,0) holds, the fourth subdecoder 13 selects (Vo1, Vo2)=[V(T1), V(T2)]=(Vr2, Vr2), and the amplifying circuit (interpolation amplifier) 30 outputs Vout=(Vr2+Vr1)/2=Vr2.

When (D1,D0)=(1,1) holds, the fourth subdecoder 13 selects (Vo1, Vo2)=[V(T1), V(T2)]=(Vr3, Vr2), and the amplifying circuit (interpolation amplifier) 30 outputs the level that is intermediate Vr2 and Vr3, namely Vout=(Vr3+Vr2)/2.

Similarly, reference voltages Vr4, Vr5 are assigned to the second section of levels 4 to 7. Level 7 at the end of the second section is generated by interpolating it from the reference voltage Vr5, which belongs to the adjacent third section (levels 8 to 11), and the reference voltage Vr4 of the second section. Accordingly, with respect to levels 4 to 7, three reference voltages (Vr3, Vr4, Vr5) are selected by the first, second and third subdecoders $11_1$, $11_2$, $11_3$ based upon the first bit group (D7 to D2), these reference voltages are supplied to the fourth subdecoder 13 and the fourth subdecoder 13 selects two of these reference voltages (inclusive of selecting the same one redundantly) based upon the second bit group (D1,D0).

More specifically, when (D1,D0)=(0,0) holds, the fourth subdecoder 13 selects (Vo1, Vo2)=[V(T1), V(T2)]=(Vr3, Vr3), and the amplifying circuit (interpolation amplifier) 30 outputs Vout=(Vr3+Vr3)/2=Vr3.

When (D1,D0)=(0,1) holds, the fourth subdecoder 13 selects (Vo1, Vo2)=[V(T1), V(T2)]=(Vr4, Vr3), and the amplifying circuit (interpolation amplifier) 30 outputs the level that is intermediate Vr3 and Vr4, namely Vout=(Vr4+Vr3)/2.

When (D1,D0)=(1,0) holds, the fourth subdecoder 13 selects (Vo1, Vo2)=[V(T1), V(T2)]=(Vr4, Vr4), and the amplifying circuit (interpolation amplifier) 30 outputs Vout=(Vr4+Vr4)/2=Vr4.

When (D1,D0)=(1,1) holds, the fourth subdecoder 13 selects (Vo1, Vo2)=[V(T1), V(T2)]=(Vr5, Vr4), and the amplifying circuit (interpolation amplifier) 30 outputs the level that is intermediate Vr4 and Vr5, namely Vout=(Vr5+Vr4)/2.

Reference voltages Vr127, Vr128 are assigned to the 64th section of levels 252 to 255. Level 255 at the end of this section is generated by interpolating it from the adjacent reference voltage Vr129 [Vr129 is the highest order reference voltage Vr(2h+1)=Vr(2×64+1) in a case where h=64] and the reference voltage Vr128 in the $64^{th}$ section. Accordingly, with respect to levels 252 to 255, three reference voltages (Vr127, Vr128, Vr129) are selected by the first, second and third subdecoders $11_1$, $11_2$, $11_3$ based upon the first bit group (D7 to D2), these reference voltages are supplied to the fourth subdecoder 13 and the fourth subdecoder 13 selects two of these reference voltages (inclusive of selecting the same one redundantly) based upon the second bit group (D1,D0).

More specifically, when (D1,D0)=(0,0) holds, the fourth subdecoder 13 selects (Vo1, Vo2)=[V(T1), V(T2)]=(Vr127, Vr127), and the amplifying circuit (interpolation amplifier) 30 outputs Vout=(Vr127+Vr127)/2=Vr127.

When (D1,D0)=(0,1) holds, the fourth subdecoder 13 selects (Vo1, Vo2)=[V(T1), V(T2)]=(Vr128, Vr127), and the amplifying circuit (interpolation amplifier) 30 outputs the level that is intermediate Vr127 and Vr128, namely Vout=(Vr128+Vr127)/2.

When (D1,D0)=(1,0) holds, the fourth subdecoder 13 selects (Vo1, Vo2)=[V(T1), V(T2)]=(Vr128, Vr128), and the amplifying circuit (interpolation amplifier) 30 outputs Vout=(Vr128+Vr128)/2=Vr128.

When (D1,D0)=(1,1) holds, the fourth subdecoder 13 selects (Vo1, Vo2)=[V(T1), V(T2)]=(Vr129, Vr128), and the amplifying circuit (interpolation amplifier) 30 outputs the level that is intermediate Vr128 and Vr129, namely Vout=(Vr129+Vr128)/2.

Figure 6:
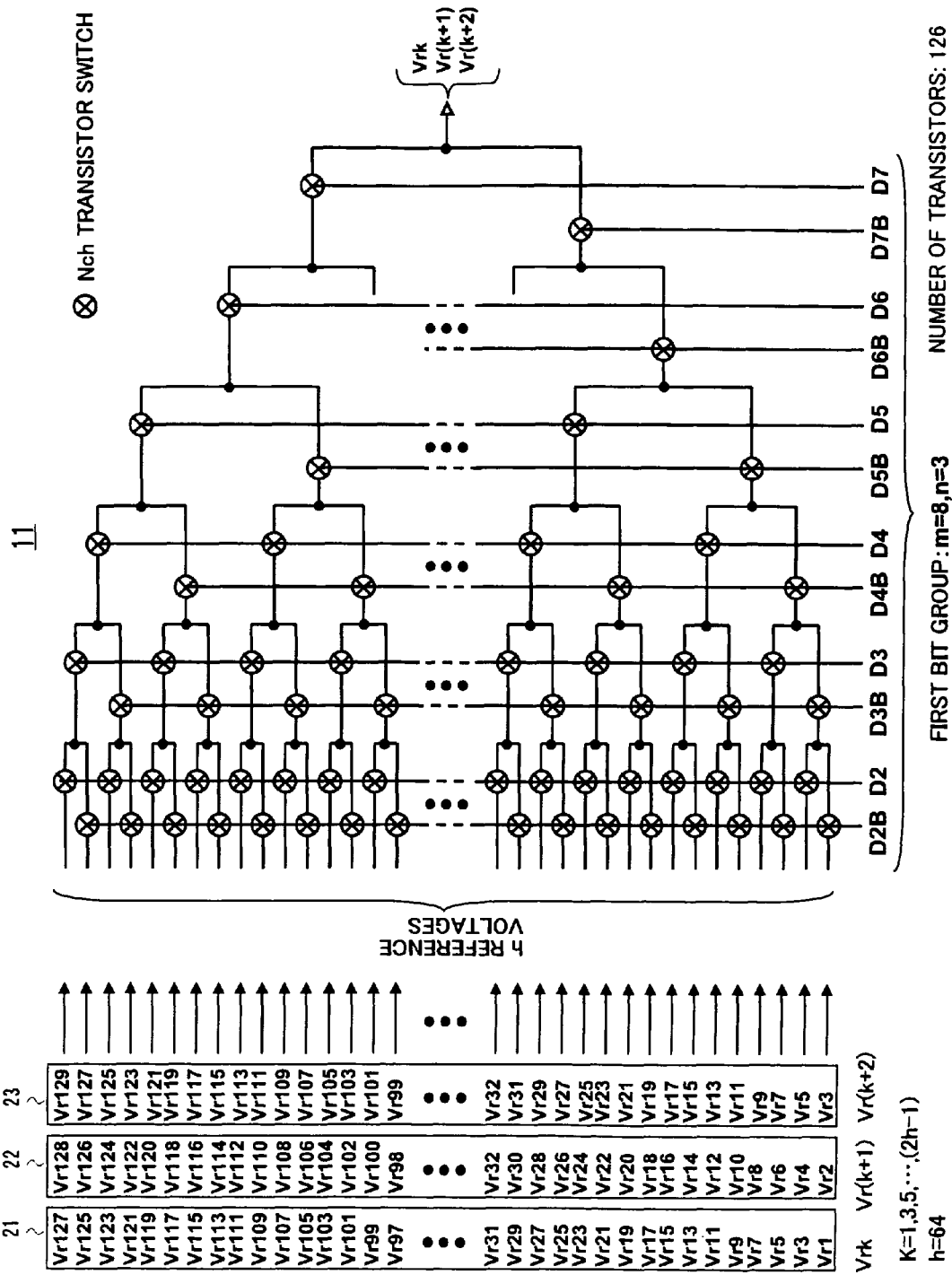
FIG. 6 is a diagram illustrating the configuration of a subdecoder 11 of FIG. 1 in the concrete example of FIG. 5.

FIG. 6 is a diagram illustrating an example of the configuration of the first, second and third subdecoders $11_1$, $11_2$, $11_3$, respectively, of FIG. 1 according to the exemplary embodiment (m=8, n=2, h=64) illustrated in FIG. 5. The first, second and third subdecoders $11_1$, $11_2$, $11_3$ are identically constructed, as set forth above. In FIG. 6, reference voltages are selected sequentially from lower order bits (D2, D2B) to higher order bits (D7, D7B) with the bits of the first bit group Dn to D(m−1) of FIG. 1 being the six bits (D2, D2B, ... D7, D7B).

For the sake of illustration in the drawing, the arrangement shown in FIG. 6 is such that h-number of reference voltages are supplied to one subdecoder with three reference voltages being adopted as one set. However, three of the subdecoders 11 of FIG. 6 are provided in correspondence with the first reference voltage group 21 (Vr1, Vr3, ..., Vrk, ..., Vr125, Vr127), the second reference voltage group 22 (Vr2, Vr4, ..., Vr(k+1), ..., Vr126, Vr128) and third reference voltage group 23 (Vr3, Vr5, ..., Vr(k+2), ..., Vr127, Vr129). The first to third subdecoders $11_1$, $11_2$, $11_3$ output Vrk, Vr(k+1), Vr(k+2), respectively.

The first subdecoder $11_1$ has a tournament configuration. One of two adjacent reference voltages in each of the pairs (Vr1, Vr3), (Vr5, Vr7), ... (Vr125, Vr127) of the first reference voltage group 21 is selected by Nch transistor switches connected to respective ones of lower order bits (D2, D2B) of the first bit group. In the case of Nch transistor switches connected to respective ones of (D3, D3B), one of the two reference voltages that have been selected by the Nch transistor switches connected to respective ones of the bits (D2, D2B) that are one order lower is selected. Thereafter, and in similar fashion, in the case of Nch transistor switches connected to higher order bits, one of two reference voltages that have been selected at the lower order bits is selected. Finally, in the case of Nch transistors connected to (D7, D7B), one reference voltage Vrk of two reference voltages that have been selected by Nch transistor switches connected to bits (D6, D6B) that are one order lower is output. The second and third subdecoders $11_2$, $11_3$ similarly output single reference voltages Vr(k+1), Vr(k+2), respectively, from the second and third second reference voltage groups 22, 23, respectively, based upon the first bit group (D2, D2B, ... D7, D7B). It should be noted that the Nch transistor switches connected to D2, for example, which have D2 connected to their gates, turn on when D2 is high and turn off when D2 is low. The Nch transistor switches connected to D2B, which have D2B connected to their gates, turn on when D2 is low and turn off when D2 is high.

The total number of transistor switches of the subdecoder 11 shown in FIG. 6 is 126. Further, in the subdecoder 11 shown in FIG. 6, the arrangement is such that the Nch transistor switches connected to the lower order bits (e.g., D2, D2B) of the first bit group select the reference voltage of the closer level. By virtue of such an arrangement, some of the Nch transistor switches do not require a large drain withstand voltage (the withstand voltage between the drain and substrate). Accordingly, it is possible to reduce transistor-switch size in accordance with the withstand voltage and thereby reduce circuit area.

Figure 7:
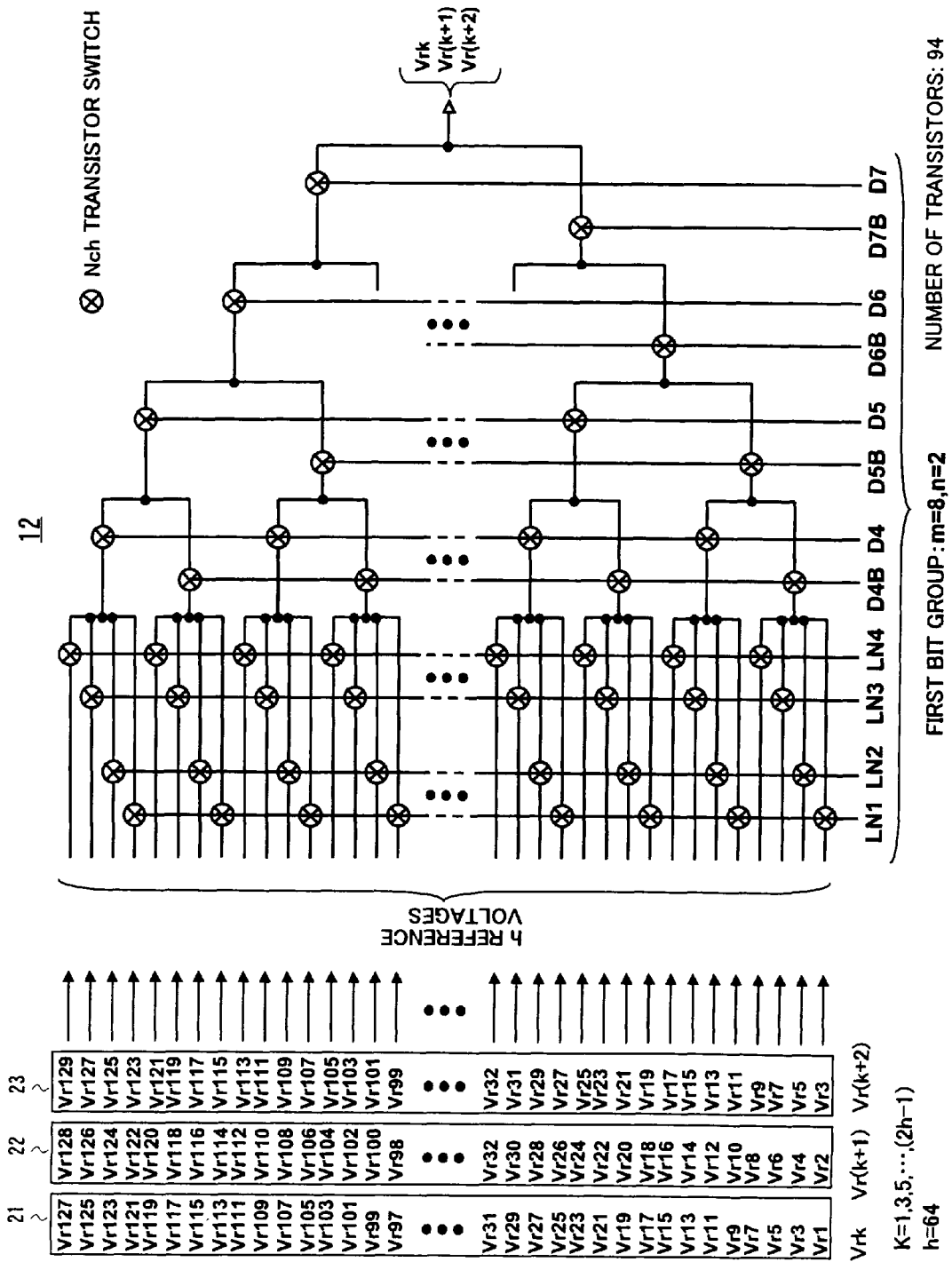
FIG. 7 is a diagram illustrating the configuration of a subdecoder 12 of FIG. 2 in the concrete example of FIG. 5.

FIG. 7 is a diagram illustrating an example of the configuration of the first, second and third subdecoders $12_1$, $12_2$, and $12_3$, respectively, of FIG. 2 according to the exemplary embodiment (m=8, n=2, h=64) illustrated in FIG. 5. (The first, second and third subdecoders $12_1$, $12_2$, and $12_3$ are identically constructed, as set forth above.)

The two lower order bits (D2, D2B, D3, D3B) from the first bit group (D2 D2B, ... D7, D7B) of FIG. 2 are supplied to the predecoder 14 [(Dx, DxB, D(x+1), D(x+1)B of FIG. 3], reference voltages are selected using the output signals LN1 to LN4 of the predecoder 14, and 16 reference voltages that have been selected by LN1 to LN4 are selected sequentially in tournament fashion from (D5, D5B) toward (D7, D7B) using the higher order bits (D5, D5B), (D6, D6B), and (D7, D7B) of the first bit group.

For the sake of illustration in the drawing, the arrangement shown in FIG. 7 is such that h-number of reference voltages are supplied to one subdecoder 12 with three reference voltages being adopted as one set. However, three of the subdecoders 12 of FIG. 7 are provided in correspondence with the first reference voltage group 21 (Vr1, Vr3, . . . , Vrk, . . . , Vr125, Vr127), the second reference voltage group 22 (Vr2, Vr4, . . . , Vr(k+1), . . . , Vr126, Vr128) and third reference voltage group 23 (Vr3, Vr5, . . . , Vr(k+2), . . . , Vr127, Vr129). The first to third subdecoders $12_1$, $12_2$, and $12_3$ output Vrk, Vr(k+1), and Vr(k+2), respectively.

On the basis of the two lower order bits (D2, D2B, D3, D3B) of the first bit group (D2, D2B, . . . D7, D7B), any one of the outputs LN1, LN2, LN3 and LN4 of the predecoder 14 of FIG. 2 attains the high level, as a result of which the first subdecoder $12_1$ selects one reference voltage from each set of four successive reference voltages (Vr1, Vr3, Vr5, Vr7), (Vr9, Vr11, Vr13, Vr15), . . . (Vr121, Vr123, Vr125, Vr127) of the first reference voltage group 21.

The Nch transistor switches connected to respective ones of (D4, D4B) select one reference voltage of the reference voltages in the two adjacent sets of four reference voltages that have been selected by the Nch transistor switches connected to respective ones of LN1, LN2, LN3 and LN4 [e.g., one reference voltage selected from among the reference voltages (Vr1, Vr3, Vr5, Vr7) and one reference voltage selected from among the reference voltages (Vr9, Vr11, Vr13, Vr15)].

In the case of Nch transistor switches connected to respective ones of (D5, D5B), one of the two reference voltages that have been selected by the Nch transistor switches connected to respective ones of (D4, D4B) is selected; in the case of Nch transistor switches connected to respective ones of (D6, D6B), one of two reference voltages that have been selected by the Nch transistor switches connected to respective ones of (D5, D5B) is selected; and in the case of Nch transistor switches connected to respective ones of (D7, D7B), one reference voltage Vrk of two reference voltages that have been selected by the Nch transistor switches connected to respective ones of (D6, D6B) is output. The second and third subdecoders $12_2$ and $12_3$ similarly output single reference voltages Vr(k+1) and Vr(k+2), respectively, from the second and third second reference voltage groups 22 and 23, respectively, based upon the first bit group (D2, D2B, D7, D7B). The total number of transistors of the subdecoder 12 shown in FIG. 7 is 94. Further, in the subdecoder 12 shown in FIG. 7, some of the Nch transistor switches connected to the lower order bits of the first bit group no longer require use of a large drain withstand voltage (the withstand voltage between the drain and substrate). Accordingly, it is possible to reduce transistor-switch size in accordance with the withstand voltage and thereby reduce circuit area.

Figure 8:
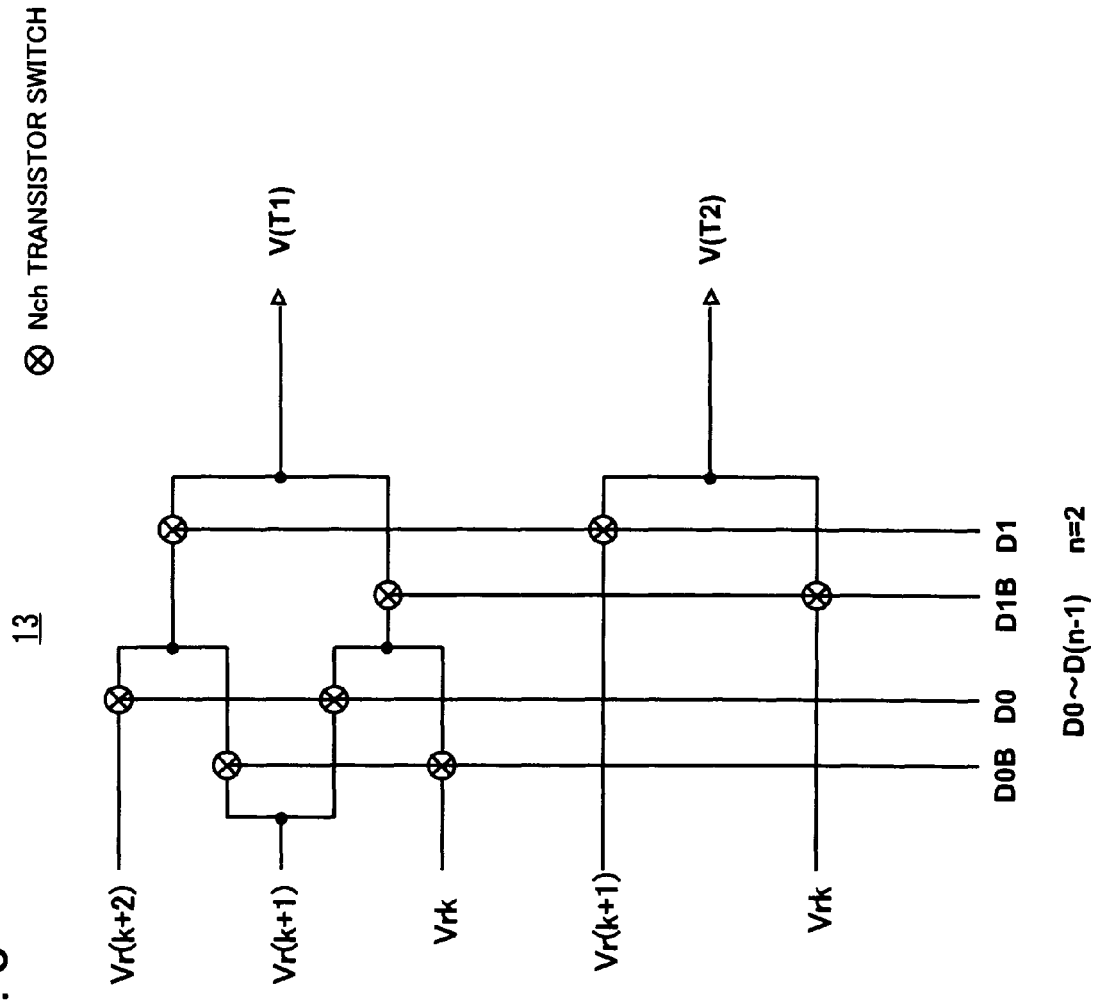
FIG. 8 is a diagram illustrating the configuration of a subdecoder 13 of FIG. 1 or FIG. 2 in the concrete example of FIG. 5.

FIG. 8 is a diagram illustrating the configuration of the fourth subdecoder 13 of FIG. 1 or 2 according to the exemplary embodiment (m=8, n=2, h=64) illustrated in FIG. 5. In FIG. 8, Vrk, Vr(k+1), and Vr(k+2) are reference voltages selected by the first to third subdecoders $11_1$ to $11_3$ ($12_1$ to $12_3$) and supplied to the fourth subdecoder 13. V(T1) and V(T2) are respective voltages at the input terminals T1 and T2 of the amplifying circuit 30.

With reference to FIG. 8, V(T1) is connected to Vrk via an Nch transistor switch connected to D1B and an Nch transistor switch connected to D0B, and to Vr(k+1) via the Nch transistor switch connected to D1B and an Nch transistor switch connected to D0. The voltage V(T1) is further connected to Vr(k+1) via an Nch transistor switch connected to D1 and the Nch transistor switch connected to D0B, and to Vr(k+2) via the Nch transistor switch connected to D1 and the Nch transistor switch connected to D0. The voltage V(T2) is connected to Vr(k+1) via the Nch transistor switch connected to D1, and to Vrk via the Nch transistor connected to D1B.

In the fourth subdecoder 13 thus constructed, [V(T1), V(T2)]=(Vrk, Vrk) is output when (D1,D0)=(0,0) holds.

[V(T1), V(T2)]=[Vr(k+1),Vrk] is output when (D1,D0)=(0,1) holds.

[V(T1), V(T2)]=[Vr(k+1),Vr(k+1)] is output when (D1, D0)=(1,0) holds.

[V(T1), V(T2)]=[Vr(k+2),Vr(k+1)] is output when (D1, D0)=(1,1) holds.

Figure 9:
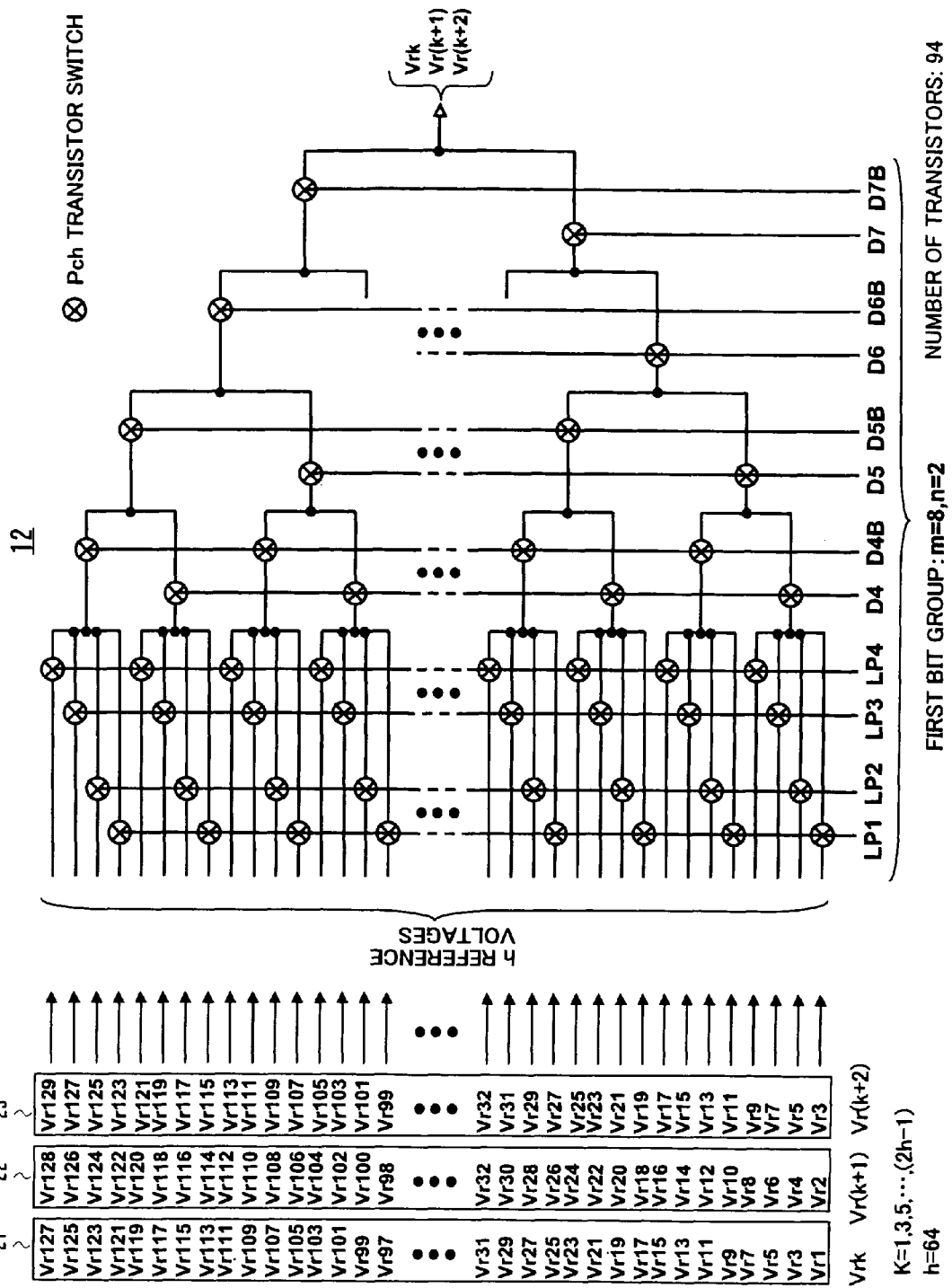
FIG. 9 is a diagram illustrating another example of the configuration of the subdecoder 12 of FIG. 2 in the exemplary embodiment of FIG. 5.

FIG. 9 is a diagram illustrating another example of the configuration of the subdecoder 12 of FIG. 2 according to the exemplary embodiment shown in FIG. 5. Here the Nch transistors of FIG. 7 are replaced by Pch transistors. In FIG. 9, on the basis of (D2, D2B, D3, D3B), any one of the outputs LP1, LP2, LP3 and LP4 of [Dx, DxB, D(x+1), D(x+1)B] of the predecoder 14 attains the high level. The subdecoder $12_1$ selects one of the four successive reference voltages (Vr1, Vr3, Vr5, Vr7), (Vr9, Vr11, Vr13, Vr15), . . . (Vr121, Vr123, Vr125, Vr127). The Pch transistor switches connected to respective ones of (D4, D4B) select one reference voltage of the reference voltages in the two adjacent sets of four reference voltages that have been selected by LP1, LP2, LP3 and LP4 [e.g., one reference voltage selected from among the reference voltages (Vr1, Vr3, Vr5, Vr7) and one reference voltage selected from among the reference voltages (Vr9, Vr11, Vr13, Vr15)]. In the case of Pch transistor switches connected to respective ones of (D5, D5B), one of two reference voltages that have been selected by the Pch transistor switches connected to respective ones of (D4, D4B) is selected; in the case of Pch transistor switches connected to respective ones of (D6, D6B), one of two reference voltages that have been selected by the Pch transistor switches connected to respective ones of (D5, D5B) is selected; and in the case of Pch transistor switches connected to respective ones of (D7, D7B), one reference voltage Vrk of two reference voltages that have been selected by the Pch transistor switches connected to respective ones of (D6, D6B) is output. The second and third subdecoders $12_2$ and $12_3$ similarly output single reference voltages Vr(k+1) and Vr(k+2), respectively, from the second and third second reference voltage groups 22 and 23, respectively, based upon the first bit group (D2, D2B, D7, D7B). In this case, the total number of transistor switches of the subdecoder 12 shown in FIG. 7 is 94.

Figure 10:
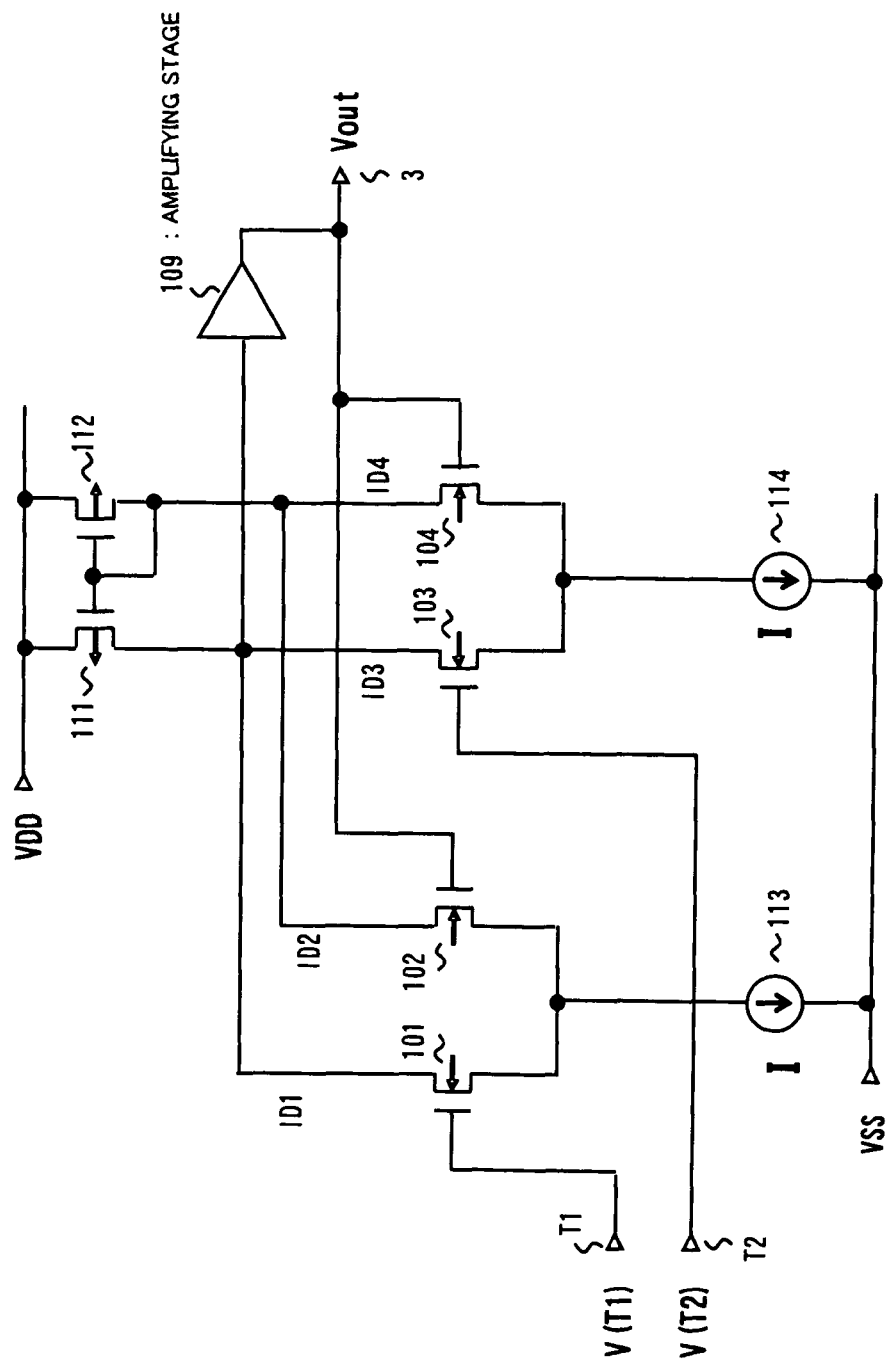
FIG. 10 is a diagram illustrating an example of the configuration of an amplifying circuit 30 in FIG. 1 or FIG. 2 in the exemplary embodiment of FIG. 5.

FIG. 10 is a diagram illustrating the configuration of the amplifying circuit (interpolation amplifier) 30 shown in FIG. 5B. (A similar configuration is disclosed in FIG. 5 of Patent Document 2.) As illustrated in FIG. 10, the amplifying circuit includes a first differential pair comprising Nch transistors 101 and 102 having commonly connected sources connected to a current source 113 and gates connected to terminal T1 [voltage V(T1)] and to output terminal 3 (output terminal voltage Vout), respectively; a second differential pair comprising Nch transistors 103 and 104 having commonly connected sources connected to a current source 114 and gates connected to terminal T2 [voltage V(T2)] and to output terminal 3, respectively; a Pch transistor 111 connected between the commonly connected drains of the Nch transistors 101 and 103 and power supply VDD; a Pch transistor 112 connected between commonly connected drains of the Nch transistors 102 and 104 and the power supply VDD and having its gate and drain connected together and its gate connected to the gate of the Pch transistor 111; and an amplifying stage 109 in which a node of connection between the drain of the Pch transistor 111 and the commonly connected drains of the Nch transistors 101 and 103 is connected to the input end, and which has its output end connected to the output terminal 3. The Pch transistors 111 and 112 construct a current mirror. The Nch transistors 101, 102, 103 and 104 are of the same size, and the current values of the current sources 113 and 114 are equal. The respective drain currents ID1, ID2, ID3 and ID4 of the Nch transistors 101, 102, 103, and 104 are given by the following:

$$ID1=(\beta/2)\,[V(T1)-VTH]^2 \quad (1)$$

$$ID2=(\beta/2)\,(Vout-VTH)^2 \quad (2)$$

$$ID3=(\beta/2)\,[V(T2)-VTH]^2 \quad (3)$$

$$ID4=(\beta/2))\,(Vout-VTH)^2 \quad (4)$$

Here $\beta$ represents a gain coefficient, and $\beta=[\mu(W/L)\,(\epsilon x/tox)]$, where $\mu$ represents the effective mobility of electrons, $\epsilon x$ the dielectric constant of a gate insulating film, tox the film thickness of the gate insulating film, W the channel width and L the channel length. Further, VTH represents a threshold voltage.

A current ID2+ID4 is a current (input current) that flows into the Pch transistor 112 on the input side of the current mirror circuit, and a current ID1+ID3 is a current (output current) that flows into the Pch transistor 111 on the output side of the current mirror circuit. Control is exercised in such a manner that the input current of the current mirror circuit will equal the output current.

$$ID1+ID3=ID2+ID4 \quad (5)$$

The expressions within the parentheses of Equations (1) to (4) are expanded and substituted into Equation (5), both sides are assumed to be equal with regard to linear terms of VTH, and V(T1)+V(T2)=2×Vout, namely $$Vout=[V(T1)+V(T2)]/2 \quad (6)$$

is obtained. Alternatively, Equation (6) is derived by substituting ID1−ID2=gm[V(T1)−Vout], ID3−ID4=gm[V(T2)−Vout] into Equation (5), where gm represents the mutual conductance of the first and second differential pairs.

Figure 23:
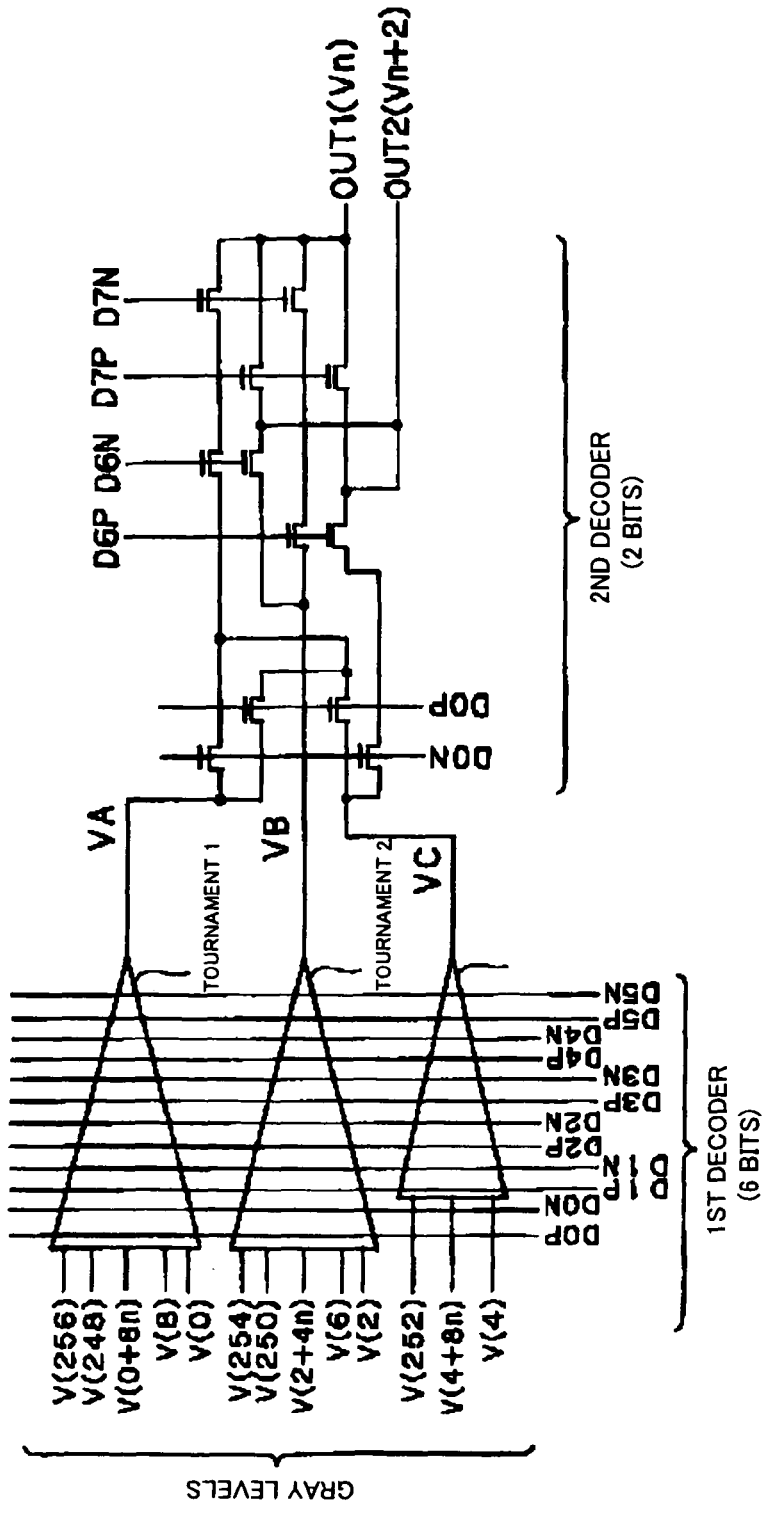
FIG. 23 is a diagram illustrating a configuration described in Patent Document 1.
Figure 24A:
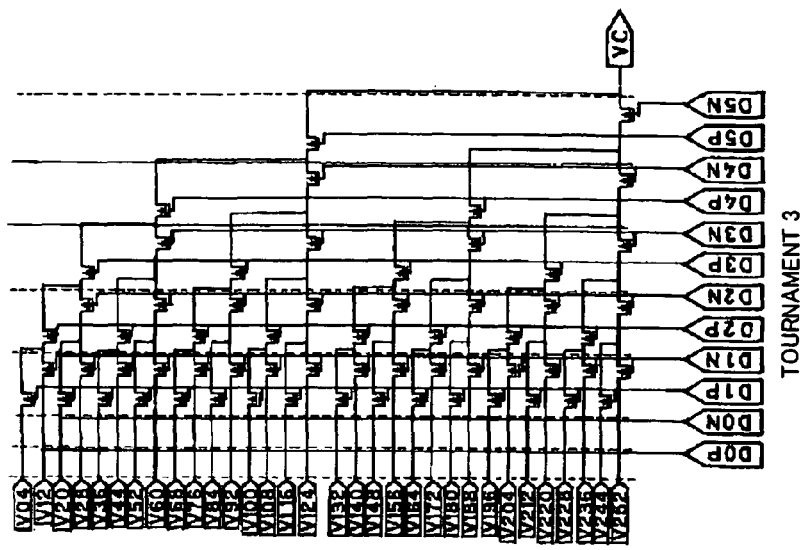
FIGS. 24A-24B are diagrams illustrating a configuration described in Patent Document 1.
Figure 24B:
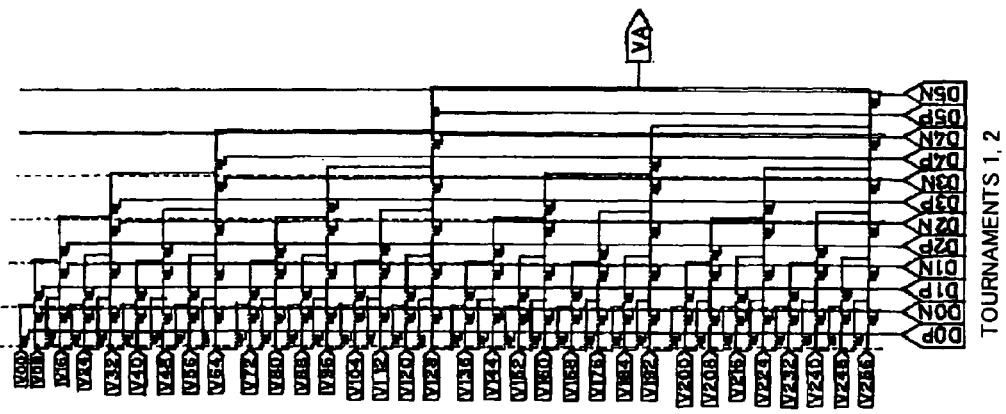

FIGS. 11A, 11B and 11C are for comparing numbers of DAC switches with this exemplary embodiment. FIG. 11A shows the numbers of switches in the case of the arrangement of FIGS. 23 and 24. The numbers of switches are 126, 126 and 62 for tournaments 1, 2 and 3, respectively, of the 1st decoder, and 12 for the 2nd decoder, in the case of eight bits, for a total of 326 switches. The numbers of switches are 510, 510 and 254 for tournaments 1, 2 and 3, respectively, of the 1st decoder, and 12 for the 2nd decoder, in the case of ten bits, for a total of 1286 switches.

FIG. 11B shows the numbers of switches in the case of the arrangement of FIGS. 1, 6 and 8 in the exemplary embodiment of FIG. 5. In the case of eight bits, circuit 11 has 126 switches, circuit 13 has eight switches, and the total number of switches is 126×3+8=386. In the case of ten bits, circuit 11 has 510 switches, circuit 13 has eight switches, and the total number of switches is 510×3+8=1538.

FIG. 11C shows the numbers of switches in the case of the arrangement of FIGS. 2, 7 and 8, which has the predecoder, in the exemplary embodiment of FIG. 5. In the case of eight bits, circuit 11 has 94 switches, circuit 13 has eight switches, and the total number of switches is 94×3+8=290. In the case of ten bits, circuit 11 has 382 switches, circuit 13 has eight switches, and the total number of switches is 382×3+8=1154.

In the case of the exemplary embodiment of FIG. 1, the number of transistor switch elements increases in comparison with Patent Document 1. With the exemplary embodiment of FIG. 2 having the predecoder, however, the number of transistor switch elements is reduced and a reduction in area can be achieved.

In the case of the arrangement of FIG. 6, with respect to m=8, n=2, and in the first subdecoder 11 and in the fourth subdecoder 13 of FIG. 8, the total number of transistor switches inserted in series in the path, through which Vrk is selected from the first reference voltage group 21 and then selected as V(T1)/V(T2) [that is, V(T1) or V(T2)], is a maximum of eight. Similarly, in the second subdecoder $11_2$ and fourth subdecoder 13, the number of switches inserted in series in the path through which Vr(k+1) is selected from the second reference voltage group 22 and then selected as V(T1)/V(T2), is a maximum of eight. Similarly, in the third subdecoder $11_3$ and fourth subdecoder 13, the number of transistor switches inserted in series in the path through which Vr(k+2) is selected from the third reference voltage group 23 and then selected as V(T1)/V(T2) is a maximum of eight.

Further, in the case of the arrangement of FIG. 7, with respect to m=8, n=2, and in the first subdecoder $12_1$ and in the fourth subdecoder 13 of FIG. 8, the number of switches inserted in series in the path through which Vrk is selected from the first reference voltage group 21 and then selected as V(T1)/V(T2) is a maximum of seven. Similarly, in the second subdecoder $12_2$ and fourth subdecoder 13, the number of switches inserted in series in the path through which Vr(k+1) is selected from the second reference voltage group 22 and then selected as V(T1)/V(T2) is a maximum of seven. In the third subdecoder $12_3$ and fourth subdecoder 13, the number of transistor switches inserted in series in the path through which Vr(k+2) is selected and output from the third reference voltage group 23 and then selected as V(T1)/V(T2) is a maximum of seven.

FIG. 12A is a diagram useful in describing operating specifications different from those of FIG. 5A with regard to the exemplary embodiment shown in FIG. 1 or FIG. 2. This exemplary embodiment is for the case m=8, n=3, h=32 holds in FIG. 1 (2h+1=65 holds, and therefore the reference voltages are Vr1 to V65). FIG. 12B illustrates the configuration of the amplifying circuit (interpolation amplifier) 30 of FIGS. 1 and 2.

"Level" (0 to 255) in FIG. 12A shows the output voltage levels of the amplifying circuit (interpolation amplifier) 30. It is possible to output 256 levels of 0 to 255.

Further, "Vref" in FIG. 12A indicates the correspondence between levels [output voltage levels of the amplifying circuit (interpolation amplifier) 30] and reference voltages. For example, the first reference voltage Vr1 of the first reference voltage group 21 corresponds to level 0, the first reference voltage Vr2 of the second reference voltage group 22 corresponds to level 4, and the first reference voltage Vr3 (which is the second reference voltage of the first reference voltage group 21) of the third reference voltage group 23 corresponds to level 8.

Further, T1, T2 and T3 in FIG. 12A stand for the input terminals of the amplifying circuit 30.

Further, D7 to D2 in FIG. 12A correspond to D(m−1)−Dn in FIG. 1 or 2, i.e., the higher order m−n=8−3=5 bits, and D2 to D0 correspond to D(n−1)−D0 in FIG. 1 or 2, i.e., three lower order bits.

The fourth subdecoder 13 in FIG. 1 or FIG. 2 output Vo1, Vo2 to the three terminals T1, T2 and T3 of the amplifying circuit (interpolation amplifier) 30. The amplifying circuit (interpolation amplifier) 30 outputs [V(T1)+V(T2)+2×V (T3)]/4 with the voltages at the three terminals T1, T2 and T3 being V(T1), V(T2) and V(T3).

In the example shown in FIG. 12A, two successive reference voltages are assigned to a section comprising eight consecutive levels, the level at the end of one section (namely the eighth level) shares one reference voltage in the adjacent section, and with respect to the 256 levels 0 to 255, 64 (which is ¼ of 256)+1=65 reference voltages are assigned.

Reference voltages Vr1, Vr2 are assigned to the first section of levels 0 to 7. Levels 5, 6 and 7 on the upper side of the first section are generated by interpolating them from reference voltage Vr3 of the second section (levels 8 to 15) and reference voltage Vr2 of the first section. Accordingly, with respect to levels 0 to 7, reference voltages (Vr1, Vr2, Vr3) of three consecutive steps are selected by the first, second and third subdecoders $11_1$, $11_2$ and $11_3$ based upon the first bit group (D7 to D3), these reference voltages are supplied to the fourth subdecoder 13 and the fourth subdecoder 13 selects two voltages Vo1, Vo2 (Vo1, Vo2 may be identical voltages) based upon the second bit group (D2, D1, D0) and outputs Vo1 and Vo2 (inclusive of outputting the same one redundantly) to the three input terminals T1, T2 and T3 of the amplifying circuit 30.

More specifically, when (D2,D1,D0)=(0,0,0) holds, the fourth subdecoder 13 selects [V(T1), V(T2), V(T3)]=(Vr1, Vr1, Vr1), and the amplifying circuit (interpolation amplifier) 30 outputs Vout=(Vr1+Vr1+2×Vr1)/4=Vr1.

When (D2,D1,D0)=(0,0,1) holds, the fourth subdecoder 13 selects [V(T1), V(T2), V(T3)]=(Vr2, Vr1, Vr1), and the amplifying circuit (interpolation amplifier) 30 outputs Vout=(Vr2+Vr1+2×Vr1)/4=Vr1+(Vr2−Vr1)/4.

When (D2,D1,D0)=(0,1,0) holds, the fourth subdecoder 13 selects [V(T1), V(T2), V(T3)]=(Vr1, Vr1, Vr2), and the amplifying circuit (interpolation amplifier) 30 outputs Vout=(Vr1+Vr1+2×Vr2)/4=Vr1+(Vr2−Vr1)/2.

When (D2,D1,D0)=(0,1,1) holds, the fourth subdecoder 13 selects [V(T1), V(T2), V(T3)]=(Vr2, Vr1, Vr2), and the amplifying circuit (interpolation amplifier) 30 outputs Vout=(Vr2+Vr1+2×Vr2)/4=Vr1+(Vr2−Vr1)×¾.

When (D2,D1,D))=(1,0,0) holds, the fourth subdecoder 13 selects [V(T1), V(T2), V(T3)]=(Vr2, Vr2, Vr2), and the amplifying circuit (interpolation amplifier) 30 outputs Vout=(Vr2+Vr2+2×Vr2)/4=Vr2.

When (D2,D1,D0)=(1,0,1) holds, the fourth subdecoder 13 selects [V(T1), V(T2), V(T3)]=(Vr3, Vr2, Vr2), and the amplifying circuit (interpolation amplifier) 30 outputs Vout=(Vr3+Vr2+2×Vr2)/4=Vr2+(Vr3−Vr2)/4.

When (D2,D1,D0)=(1,1,0) holds, the fourth subdecoder 13 selects [V(T1), V(T2), V(T3)]=(Vr3, Vr2, Vr3), and the amplifying circuit (interpolation amplifier) 30 outputs Vout=(Vr2+Vr2+2×Vr3)/4=Vr2+(Vr3−Vr2)/2.

When (D2,D1,D0)=(1,1,1) holds, the fourth subdecoder 13 selects [V(T1), V(T2), V(T3)]=(Vr3, Vr2, Vr3), and the amplifying circuit (interpolation amplifier) 30 outputs Vout=(Vr3+Vr2+2×Vr3)/4=Vr2+(Vr3−Vr2)×¾.

Reference voltages Vr63, Vr64 are assigned to the $32^{nd}$ section of levels 248 to 255, and levels 253, 254, 255 on the upper side of the $32^{nd}$ section are generated by interpolating them from the reference voltage Vr65 and the reference voltage Vr64, which is in the $32^{nd}$ first section.

Reference voltages (Vr63, Vr64, Vr65) of three consecutive steps are selected by the first, second and third subdecoders $11_1$, $11_2$ and $11_3$ based upon the first bit group (D7 to D3), these reference voltages are supplied to the fourth subdecoder 13 and the fourth subdecoder 13 selects two voltages Vo1 and Vo2 (Vo1 and Vo2 may be identical voltages) based upon the second bit group (D2, D1, D0) and outputs Vo1 and Vo2 (inclusive of outputting the same one redundantly) to the three input terminals T1, T2 and T3 of the amplifying circuit 30.

More specifically, when (D2,D1,D0)=(0,0,0) holds, the fourth subdecoder 13 selects [V(T1), V(T2), V(T3)]=(Vr63, Vr63, Vr63), and the amplifying circuit (interpolation amplifier) 30 outputs Vout=(Vr63+Vr63+2×Vr63)/4=Vr63.

When (D2,D1,D0)=(0,0,1) holds, the fourth subdecoder 13 selects [V(T1), V(T2), V(T3)]=(Vr64, Vr63, Vr63), and the amplifying circuit (interpolation amplifier) 30 outputs Vout=(Vr64+Vr63+2×Vr63)/4=Vr63+(Vr64−Vr63)/4.

When (D2,D1,D0)=(0,1,0) holds, the fourth subdecoder 13 selects [V(T1), V(T2), V(T3)]=(Vr63, Vr63, Vr64), and the amplifying circuit (interpolation amplifier) 30 outputs Vout=(Vr63+Vr63+2×Vr64)/4=Vr63+(Vr64−Vr63)/2.

When (D2,D1,D0)=(0,1,1) holds, the fourth subdecoder 13 selects [V(T1), V(T2), V(T3)]=(Vr64, Vr63, Vr64), and the amplifying circuit (interpolation amplifier) 30 outputs Vout=(Vr64+Vr63+2×Vr64)/4=Vr63+(Vr64−Vr63)×¾.

When (D2,D1,D0)=(1,0,0) holds, the fourth subdecoder 13 selects [V(T1), V(T2), V(T3)]=(Vr64, Vr64, Vr64), and the amplifying circuit (interpolation amplifier) 30 outputs Vout=(Vr64+Vr64+2×Vr64)/4=Vr64.

When (D2,D1,D0)=(1,0,1) holds, the fourth subdecoder 13 selects [V(T1), V(T2), V(T3)]=(Vr65, Vr64, Vr64), and the amplifying circuit (interpolation amplifier) 30 outputs Vout=(Vr65+Vr64+2×Vr64)/4=Vr64+(Vr65−Vr64)/4.

When (D2,D1,D0)=(1,1,0) holds, the fourth subdecoder 13 selects [V(T1), V(T2), V(T3)]=(Vr64, Vr64, Vr65), and the amplifying circuit (interpolation amplifier) 30 outputs Vout=(Vr64+Vr64+2×Vr65)/4=Vr64+(Vr65−Vr64)/2.

When (D2,D1,D0)=(1,1,1) holds, the fourth subdecoder 13 selects [V(T1), V(T2), V(T3)]=(Vr65, Vr64, Vr65), and the amplifying circuit (interpolation amplifier) 30 outputs Vout=(Vr65+Vr64+2×Vr65)/4=Vr64+(Vr65−Vr64)×¾.

FIG. 13 is a diagram illustrating an example of the configuration of the first, second and third subdecoders $11_1$, $11_2$ and $11_3$ (identically constructed) respectively, of FIG. 1 according to the exemplary embodiment (m=8, n=3, h=32) illustrated in FIG. 12.

As illustrated in FIG. 13, the subdecoder 11 is constructed as a tournament-type decoder that sequentially selects reference voltages from the side of lower order bits (D3, D3B) toward higher order bits (D7, D7B) with the first bit group of FIG. 1 being (D3, D3B, . . . , D7, D7B).

For the sake of illustration in the drawing, the arrangement shown in FIG. 13 is such that h-number of reference voltages are supplied to one subdecoder 11 with three reference voltages being adopted as one set. However, three of the subdecoders 11 of FIG. 12 are provided in correspondence with the first reference voltage group 21 (Vr1, Vr3, . . . , Vrk, . . . , Vr61, Vr63), the second reference voltage group 22 (Vr2, Vr4, . . . , Vr(k+1), . . . , Vr62, Vr64) and third reference voltage group 23 (Vr3, Vr5, . . . , Vr(k+2), . . . , Vr63, Vr65). The first to third subdecoders $11_1$ to $11_3$ output Vrk, Vr(k+1) and Vr(k+2), respectively.

With the first subdecoder $11_1$, in the case of Nch transistor switches connected to bits (D3, D3B) on the lower order side of the first bit group, one of two successive reference voltages in each of the pairs (Vr1, Vr3), (Vr5, Vr9), . . . (Vr61, Vr63) of the first reference voltage group 21 is selected; and in the case of Nch transistor switches connected to higher order bits (D4, D4B), one of two reference voltages that have been selected by the Nch transistor switches connected to (D3, D3B) is selected. Thereafter, and in similar fashion, in the case of higher order bits, one of two reference voltages that have been selected by Nch transistor switches connected to bits that are one order lower is selected. Finally, in the case of Nch transistors connected to (D7, D7B), one reference voltage of two reference voltages that have been selected by Nch transistor switches connected to bits (D6, D6B) that are one order lower is selected and Vrk is output. The second and third subdecoders $11_2$, $11_3$ similarly select and output Vr(k+1) and Vr(k+2), respectively, based upon the first bit group. In this case, the total number of transistor switches of the subdecoder 11 is 62.

FIG. 14 is a diagram illustrating an example of the configuration of the subdecoders $12_1$ to $12_3$ (identically constructed) of FIG. 1 according to the exemplary embodiment (m=8, n=3, h=32) illustrated in FIG. 12.

The first bit group Dn to D(m−1) of FIG. 2 is (D3, D3B, ... D7, D7B). Among these bits, two lower order bits (D3, D3B, D4, D4B) are supplied to the predecoder 14 as [Dx, DxB, D(x+1), D(x+1)B] of FIG. 3. The subdecoder 12 sequentially selects reference voltages based on the signals LN1 to LN4, which have been decoded by the predecoder 14, toward the higher order bits (D5, D5B), (D6, D6B) and (D7, D7B) of the first bit group.

For the sake of illustration in the drawing, the arrangement shown in FIG. 14 is such that h-number of reference voltages are supplied to the subdecoder 12 with three successive reference voltages being adopted as one set. However, three of the subdecoders 12 of FIG. 14 are provided in correspondence with the first reference voltage group 21 (Vr1, Vr3, ..., Vrk, ..., Vr61, Vr63), the second reference voltage group 22 (Vr2, Vr4, ..., Vr(k+1), ..., Vr62, Vr64) and third reference voltage group 23 (Vr3, Vr5, ..., Vr(k+2), ..., Vr63, Vr65). The first to third subdecoders $12_1$, $12_2$ and $12_3$ output Vrk, Vr(k+1) and Vr(k+2), respectively.

With reference to FIG. 14, on the basis of (D3, D3B, D4, D4B), any one of the outputs LN1, LN2, LN3 and LN4 of the predecoder 14 of FIG. 2 attains the high level, as a result of which the first subdecoder $12_1$ selects one reference voltage from each set of four successive reference voltages (Vr1, Vr3, Vr5, Vr7), (Vr9, Vr11, Vr13, Vr15), ... and (Vr57, Vr59, Vr61, Vr63) of the first reference voltage group 21. The Nch transistor switches connected to (D5, D5B) select one reference voltage of the reference voltages in the two adjacent sets of four reference voltages that have been selected by LN1, LN2, LN3 and LN4 [e.g., one reference voltage selected from among the reference voltages (Vr1, Vr3, Vr5, Vr7) and one reference voltage selected from among the reference voltages (Vr9, Vr11, Vr13, Vr15)]. In the case of Nch transistor switches connected to (D6, D6B), one of two reference voltages that have been selected by the Nch transistor switches connected to (D5, D5B) is selected; and in the case of Nch transistor switches connected to (D7, D7B), the reference voltage Vrk, which is one of two reference voltages that have been selected by the Nch transistor switches connected to (D6, D6B) is selected. The second and third subdecoders $12_2$ and $12_3$ similarly select and output reference voltages Vr(k+1) and Vr(k+2), respectively, based upon the outputs LN1, LN2, LN3 and LN4 and (D5, D5B, ..., D7, D7B) of the predecoder 14. The total number of transistor switches of the subdecoder 12 in this case is 46.

Figure 15:
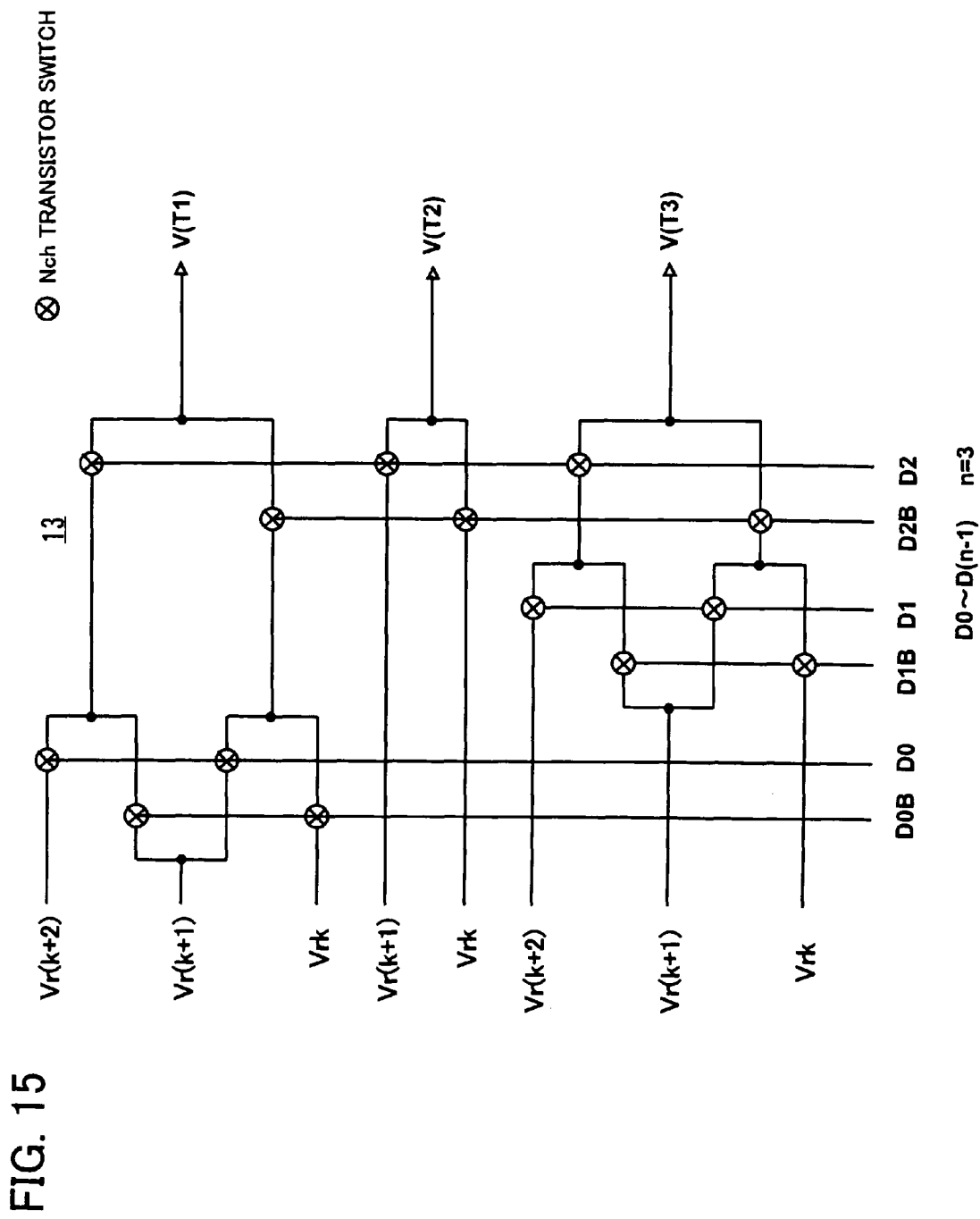
FIG. 15 is a diagram illustrating the configuration of the subdecoder 13 of FIG. 11 or FIG. 2 in the concrete example of FIG. 12.

FIG. 15 is a diagram illustrating the configuration of the fourth subdecoder 13 of FIG. 1 or 2 according to the exemplary embodiment (m=8, n=3, h=32) illustrated in FIG. 12. With reference to FIG. 15, V(T1) is connected to Vrk via an Nch transistor switch connected to D2B and an Nch transistor switch connected to D0B; to Vr(k+1) via the Nch transistor switch connected to D2B and an Nch transistor switch connected to D0; to Vr(k+1) via an Nch transistor switch connected to D2 and the Nch transistor switch connected to D0B; and to Vr(k+2) via the Nch transistor switch connected to D2 and the Nch transistor switch connected to D0.

Further, V(T2) is connected to Vrk via the Nch transistor switch connected to D2B and to Vr(k+1) via the transistor switch connected to D2.

Further, V(T3) is connected to Vrk via the Nch transistor switch connected to D2B and the Nch transistor switch connected to D1B; to Vr(k+1) via the Nch transistor switch connected to D2B and the Nch transistor switch connected to D1; to Vr(k+1) via the Nch transistor switch connected to D2 and the Nch transistor switch connected to D1B; and to Vr(k+2) via the Nch transistor switch connected to D2 and the Nch transistor switch connected to D1.

More specifically, [V(T1), V(T2), V(T3)]=(Vrk, Vrk, Vrk) is output when (D2,D1,D0)=(0,0,0) holds.

[V(T1), V(T2), V(T3)]=[Vr(k+1),Vrk,Vrk] is output when (D2,D1,D0)=(0,0,1) holds.

[V(T1), V(T2), V(T3)]=[Vrk,Vrk,Vr(k+1)] is output when (D2,D1,D0)=(0,1,0) holds.

[V(T1), V(T2), V(T3)]=[Vr(k+1),Vrk,Vr(k+1)] is output when (D2,D1,D0)=(0,1,1) holds.

[V(T1), V(T2), V(T3)]=[Vr(k+1),Vr(k+1),Vr(k+1)] is output when (D2,D1,D0)=(1,0,0) holds.

[V(T1), V(T2), V(T3)]=[Vr(k+2),Vr(k+1),Vr(k+1)] is output when (D2,D1,D0)=(1,0,1) holds.

[V(T1), V(T2), V(T3)]=[Vr(k+1),Vr(k+1),Vr(k+2)] is output when (D2,D1,D0)=(1,1,0) holds.

[V(T1), V(T2), V(T3)]=[Vr(k+2),Vr(k+1),Vr(k+2)] is output when (D2,D1,D0)=(1,1,1) holds.

In the exemplary embodiment of FIG. 12 (m=8, n=3, h=32), in the case where the first subdecoder $11_1$ of FIG. 1 is as shown in FIG. 13 and the fourth subdecoder 13 is as shown in FIG. 15, the total number of switches inserted in series in the path through which Vrk is selected from the first reference voltage group 21 and then selected as V(T1)/V(T2) [that is, V(T1) or V(T2)] is a maximum of seven. Similarly, in the second subdecoder $11_2$ and fourth subdecoder 13, the number of switches serially inserted into the path through which Vr(k+1) is selected from the second reference voltage group 22 and then selected as V(T1)/V(T2) is a maximum of seven. Similarly, in the third subdecoder $11_3$ and fourth subdecoder 13, the number of transistor switches serially inserted into the path through which Vr(k+2) is selected from the third reference voltage group 23 and then selected as V(T1)/V(T2) is a maximum of seven.

Further, in the exemplary embodiment of FIG. 12 (m=8, n=3, h=32), in the case where the first subdecoder $12_1$ of FIG. 2 is as shown in FIG. 14 and the fourth subdecoder 13 is as shown in FIG. 15, the number of switches inserted in series in the path through which Vrk is selected from the first reference voltage group 21 and then selected as V(T1)/V(T2) is a maximum of six. Similarly, in the second subdecoder $12_2$ and fourth subdecoder 13, the number of switches inserted in series in the path through which Vr(k+1) is selected from the second reference voltage group 22 and then selected as V(T1)/V(T2) is a maximum of six. In the third subdecoder $12_3$ and fourth subdecoder 13, the number of transistor switches inserted in series in the path through wselected as V(T1)/V(T2) is a maximum of six.

Figure 16:
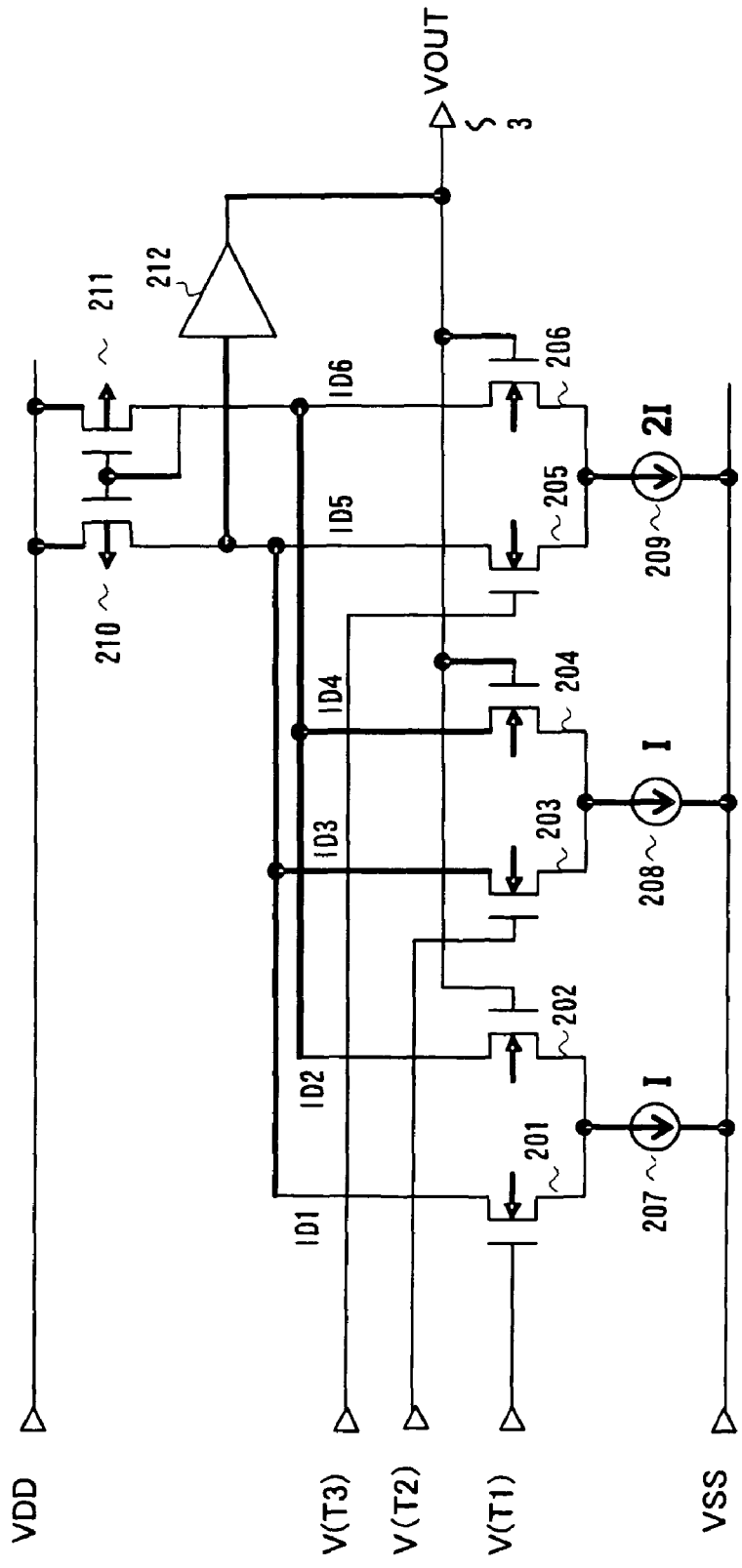
FIG. 16 is a diagram illustrating an example of the configuration of the amplifying circuit 30 in FIG. 1 or FIG. 2 in the exemplary embodiment of FIG. 12.

FIG. 16 is a diagram illustrating the configuration of the amplifying circuit shown in FIG. 12B. (A configuration similar to that of FIG. 16 is disclosed in FIG. 2 of Patent Document 3.) The amplifying circuit includes a first differential pair comprising Nch transistors 201 and 202 having commonly connected sources connected to a current source 207 and gates connected to terminal T1 [voltage V(T1)] and output terminal 3 (output terminal voltage Vout), respectively; a second differential pair comprising Nch transistors 203 and 204 having commonly connected sources connected to a current source 208 (the current value of which is equal to current value 1 of the current source 207) and gates connected to terminal T2 [voltage V(T2)] and to output terminal 3, respectively; a third differential pair comprising Nch transistors 205 and 206 ( the gate width of which is 2 W) having commonly connected sources connected to a current source 209, the current value of which is equal to the current value 1 of the current source 207) and gates connected to T2 [voltage V(T3)] and to output terminal 3, respectively; a Pch transistor 210 connected between the commonly connected drains of the Nch transistors 201, 203 and 205 and power supply VDD; a Pch transistor 211 connected between commonly connected drains of the Nch transistors 202, 204 and 206 and the power supply VDD and having its gate and drain connected together and its gate connected to the gate of the Pch transistor 210; and an amplifying stage 212 in which a node of connection between the drain of the Pch transistor 210 and the commonly connected drains of the Nch transistors 201, 203 and 205 is connected to the input end, and which has its output end connected to the output terminal 3. The Pch transistors 210 and 211 construct a current mirror. If the gain coefficient of the Nch transistors 201, 202, 203 and 204 is β, then the gain coefficient of the Nch transistors 205 and 206 will be 2 β. Accordingly, the drain currents ID1, ID2, ID3, ID4, ID5 and ID6 of the Nch transistors 201 to 206 are given by the following:

$$ID1 = (\beta/2) [V(T1) - VTH]^2 \quad (7)$$

$$ID2 = (\beta/2) (Vout - VTH)^2 \quad (8)$$

$$ID3 = (\beta/2) [V(T2) - VTH]^2 \quad (9)$$

$$ID4 = (\beta/2) (Vout - VTH)^2 \quad (10)$$

$$ID5 = 2(\beta/2) [V(T3) - VTH]^2 \quad (11)$$

$$ID6 = 2(\beta/2) (Vout - VTH)^2 \quad (12)$$

A current ID2+ID4+ID6 is a current (input current) that flows into the Pch transistor 211 on the input side of the current mirror circuit, and a current ID1+ID3+ID5 is a current (output current) that flows into the Pch transistor 111 on the output side of the current mirror circuit. The input current of the current mirror circuit becomes equal to the output current.

$$ID1 + ID3 + ID5 = ID2 + ID4 + ID6 \quad (13)$$

The expressions within the parentheses of Equations (7) to (12) are expanded and substituted into Equation (13), both sides are assumed to be equal with regard to linear terms of VTH, and V(T1)+V(T2)+2×V(T3)=4×Vout, namely $$Vout = [V(T1) + V(T2) + 2 \times V(T3)]/4 \quad (14)$$

is obtained.

Figure 22A:
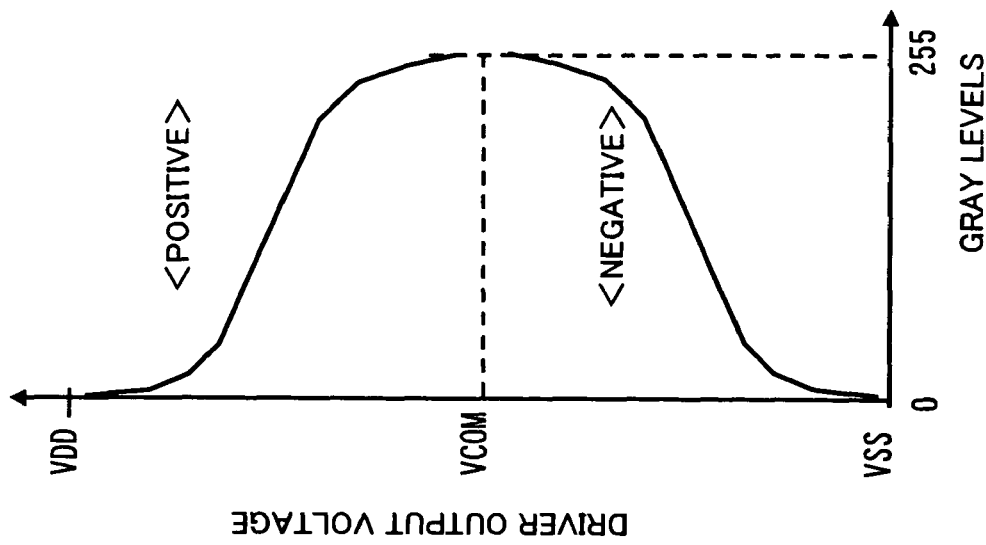
FIG. 22A is a diagram illustrating the relationship between voltage applied to liquid crystal and transmittance.
Figure 22B:
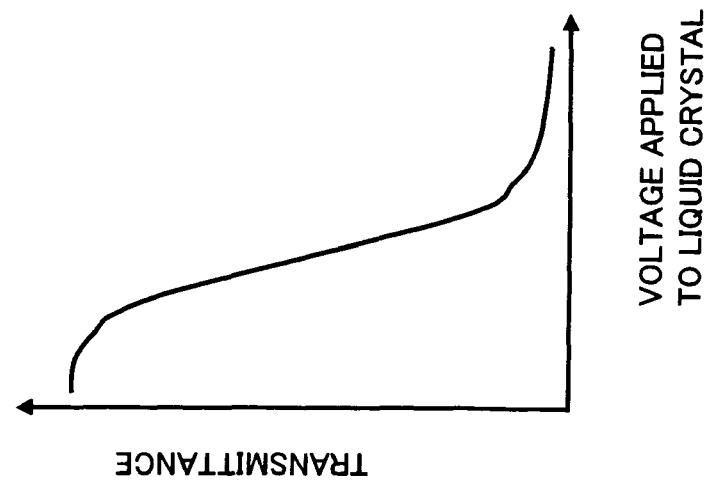
FIG. 22B is a diagram illustrating the relationship between gray levels and output voltage of a data driver.

FIG. 17A is a diagram useful in describing another example of operating specifications of the exemplary embodiment illustrated in FIG. 1 or 2. This exemplary embodiment is for the case m=8, n=2, h=62 holds in FIGS. 1 and 2. FIG. 17B is a diagram useful in describing the amplifying circuit 30. The output Vout is [V(T1)+V(T2)]/2. In positive and negative drive, as described above with reference to FIG. 22, in areas at both ends of gray level 0 and gray level 255, where there are 256 levels (eight bits), the amount of change in driver output voltage per gray level is greater than the sections of the other halftones (γcharacteristic). If the potential difference between two reference voltages is large, there are cases where a gray-scale voltage generated by an interpolation output between two different reference voltages will depend upon a variation in the elements that construct the amplifying circuit 30, as a result of which the output error increases. Accordingly, in this exemplary embodiment, reference voltage groups that are separate from the first to third reference voltage groups 21 to 23 are prepared as these reference voltage groups at both ends.

As shown in FIG. 17A, Vr1, Vr2, Vr3, . . . corresponds to levels 4, 6, 8, 10, Vrj corresponds to level 2×(j−1)+4, and Vr123, Vr124 and Vr125 [=Vr(2×h+1)] correspond to levels 248, 250 and 252, respectively.

The reference voltages Vref of levels 0, 1, 2, 3 are made voltages of a fourth reference voltage group 24 (Vrd1, Vrd2, Vrd3, Vrd4). That is, in the case of levels 0, 1, 2, 3, [V(T1), V(T2)]=(Vrd1, Vrd1), (Vrd2, Vrd2), (Vrd3, Vrd3), (Vrd4, Vrd4) are supplied to the input terminals (T1, T2), respectively, of the amplifying circuit (interpolation amplifier) 30. The amplifying circuit 30 outputs output voltage level Vout= [V(T1)+V(T2)]/2=V(T1) (=Vrd1, Vrd2, Vrd3, Vrd4), which is the same as the input voltage level V(T1) [=V(T2)].

The reference voltages Vref of levels 252, 253, 254 and 255 are made voltages of a fifth reference voltage group 25 (Vr125, Vrd5, Vrd6, Vrd7). It should be noted that Vr125 is shared with the third reference voltage group. In the case of levels 252, 253, 254 and 255, [V(T1), V(T2)]=(Vr125, Vr125), (Vrd5, Vrd5), (Vrd6, Vrd6), (Vrd7, Vrd7) are supplied to the input terminals (T1, T2) of the amplifying circuit (interpolation amplifier) 30. The amplifying circuit 30 outputs output voltage level Vout=[V(T1)+V(T2)]/2=V(T1) (=Vr125, Vrd5, Vrd6, Vrd7), which is the same as the input voltage level V(T1) [=V(T2)].

Reference voltages Vr1 and Vr2 are assigned to the section of levels 4 to 7. Level 7 at the end of this section is generated by interpolating it from the reference voltage Vr3 of the adjacent section (levels 8 to 11) and the reference voltage Vr2 of this section. Accordingly, with respect to levels 4 to 7, reference voltages (Vr1, Vr2, Vr3) of three consecutive steps are selected by the subdecoders 11$_1$, 11$_2$, 11$_3$ based upon the first bit group (D7 to D2), these reference voltages are supplied to the fourth subdecoder 13 and the fourth subdecoder 13 selects two of these reference voltages (inclusive of selecting the same one redundantly) based upon the second bit group (D1,D0).

More specifically, when (D0,D1)=(0,0) holds, the fourth subdecoder 13 selects [V(T1), V(T2)]=(Vr1, Vr1), and the amplifying circuit (interpolation amplifier) 30 outputs Vout= (Vr1+Vr1)/2=Vr1.

When (D0,D1)=(0,1) holds, the fourth subdecoder 13 selects [V(T1), V(T2)]=(Vr2, Vr1), and the amplifying circuit (interpolation amplifier) 30 outputs the level Vout that is intermediate Vr1 and Vr2, namely Vout=(Vr2+Vr1)/2.

When (D0,D1)=(1,0) holds, the fourth subdecoder 13 selects [V(T1), V(T2)]=(Vr2, Vr2), and the amplifying circuit (interpolation amplifier) 30 outputs Vout=(Vr2+Vr2)/2=Vr2.

When (D0,D1)=(1,1) holds, the fourth subdecoder 13 selects [V(T1), V(T2)]=(Vr3, Vr2), and the amplifying circuit (interpolation amplifier) 30 outputs the level that is intermediate Vr2 and Vr3, namely Vout=(Vr3+Vr2)/2.

Reference voltages Vr3 and Vr4 are assigned to the section of levels 8 to 11. Level 11 at the end of this section is generated by interpolating it from the reference voltage Vr5 of the adjacent section (levels 12 to 15) and the reference voltage Vr4 of this section. Accordingly, with respect to levels 8 to 11, reference voltages (Vr3, Vr4, Vr5) of three consecutive steps are selected by the subdecoders 11$_1$, 11$_2$ and 11$_3$ based upon the first bit group (D7 to D2), these reference voltages are supplied to the fourth subdecoder 13 and the fourth subdecoder 13 selects two of these reference voltages (inclusive of selecting the same one redundantly) based upon the second bit group (D1,D0).

More specifically, when (D0,D1)=(0,0) holds, the fourth subdecoder 13 selects [V(T1), V(T2)]=(Vr3, Vr3), and the amplifying circuit (interpolation amplifier) 30 outputs Vout=(Vr3+Vr3)/2=Vr3.

When (D0,D1)=(0,1) holds, the fourth subdecoder 13 selects [V(T1), V(T2)]=(Vr4, Vr3), and the amplifying circuit (interpolation amplifier) 30 outputs the level Vout that is intermediate Vr3 and Vr4, namely Vout=(Vr4+Vr3)/2.

When (D0,D1)=(1,0) holds, the fourth subdecoder 13 selects [V(T1), V(T2)]=(Vr4, Vr4), and the amplifying circuit (interpolation amplifier) 30 outputs Vout=(Vr4+Vr4)/2=Vr4.

When (D0,D1)=(1,1) holds, the fourth subdecoder 13 selects [V(T1), V(T2)]=(Vr5, Vr4), and the amplifying circuit (interpolation amplifier) 30 outputs the level that is intermediate Vr4 and Vr5, namely Vout=(Vr5+Vr4)/2.

Reference voltages Vr123 and Vr124 are assigned to the section of levels 248 to 251. Level 251 at the end of this section is generated by interpolating it from the adjacent reference voltage Vr125 and the reference voltage Vr124 of this section. Accordingly, with respect to levels 248 to 251, reference voltages (Vr123, Vr124, Vr125) of three consecutive steps are selected by the subdecoders $11_1$, $11_2$ and $11_3$ based upon the first bit group (D7 to D2), these reference voltages are supplied to the fourth subdecoder 13 and the fourth subdecoder 13 selects two of these reference voltages (inclusive of selecting the same one redundantly) based upon the second bit group (D1,D0).

More specifically, when (D0,D1)=(0,0) holds, the fourth subdecoder 13 selects [V(T1), V(T2)]=(Vr123, Vr123), and the amplifying circuit (interpolation amplifier) 30 outputs Vout=(Vr123+Vr123)/2=Vr3.

When (D0,D1)=(0,1) holds, the fourth subdecoder 13 selects [V(T1), V(T2)]=(Vr124, Vr123), and the amplifying circuit (interpolation amplifier) 30 outputs the level Vout that is intermediate Vr123 and Vr124, namely Vout=(Vr124+Vr123)/2.

When (D0,D1)=(1,0) holds, the fourth subdecoder 13 selects [V(T1), V(T2)]=(Vr124, Vr124), and the amplifying circuit (interpolation amplifier) 30 outputs Vout=(Vr124+Vr124)/2=Vr124.

When (D0,D1)=(1,1) holds, the fourth subdecoder 13 selects [V(T1), V(T2)]=(Vr125, Vr124), and the amplifying circuit (interpolation amplifier) 30 outputs the level that is intermediate Vr124 and Vr125, namely Vout=(Vr125+Vr124)/2.

Figure 18:
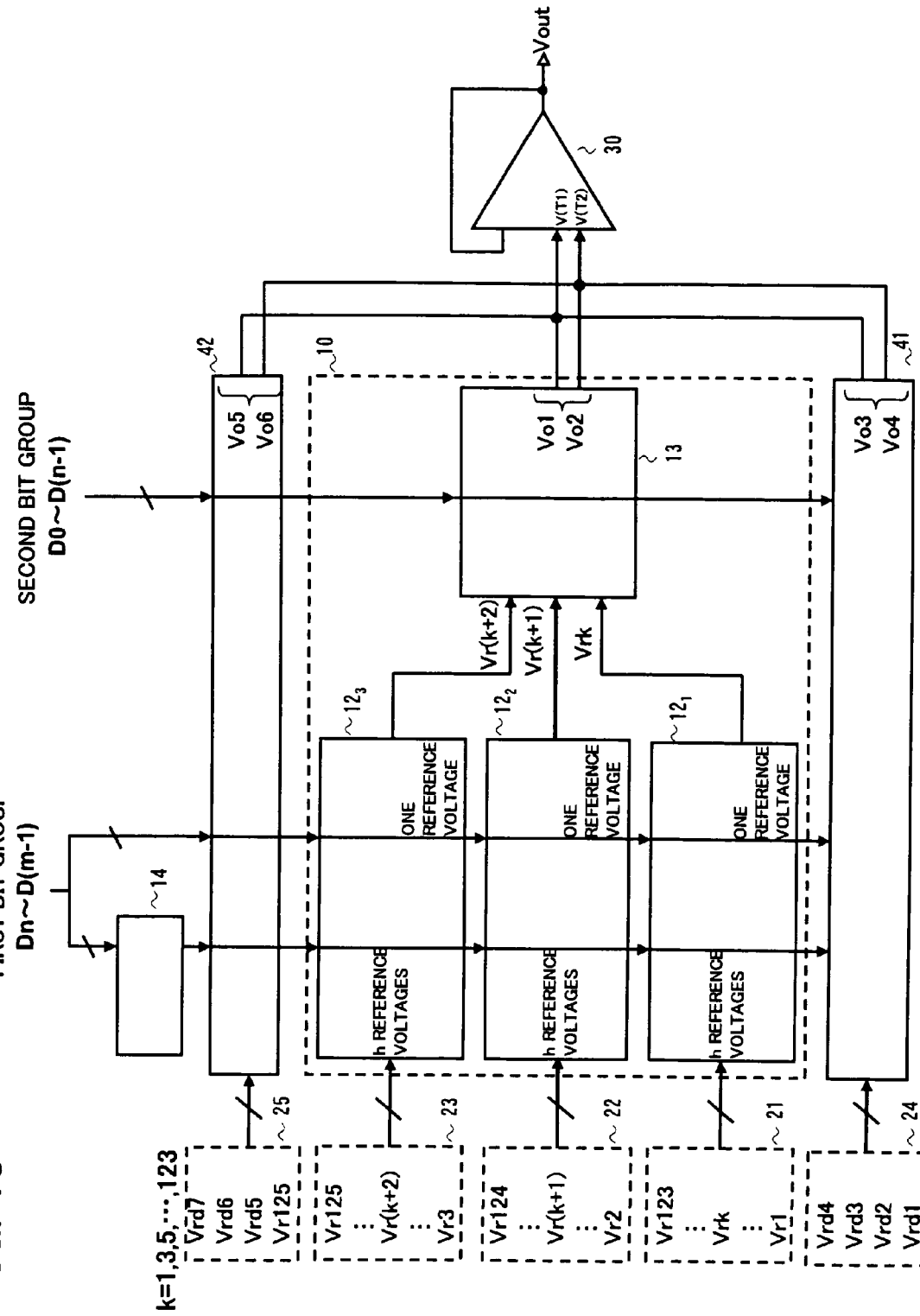
FIG. 18 is a diagram illustrating the configuration of a DAC in the concrete example of FIG. 12.

FIG. 18 is a diagram illustrating the configuration of a DAC having the specifications shown in FIG. 17. In FIG. 18, the reference voltage group 21 of (Vr1, Vr3, . . . , Vr121, Vr123), the reference voltage group 22 of (Vr2, Vr4, . . . , Vr122, Vr124) and the reference voltage group 23 of (Vr3, Vr5, . . . , Vr123, Vr125) are supplied to the subdecoders $12_1$, $12_2$ and $12_3$, respectively. A signal obtained by decoding the first bit group by the predecoder 14 and the higher order bits are supplied to the subdecoders $12_1$, $12_2$ and $12_3$ in a manner similar to that of the configuration shown in FIG. 2, and each subdecoder selects one reference voltage from h-number of reference voltages.

Figure 19:
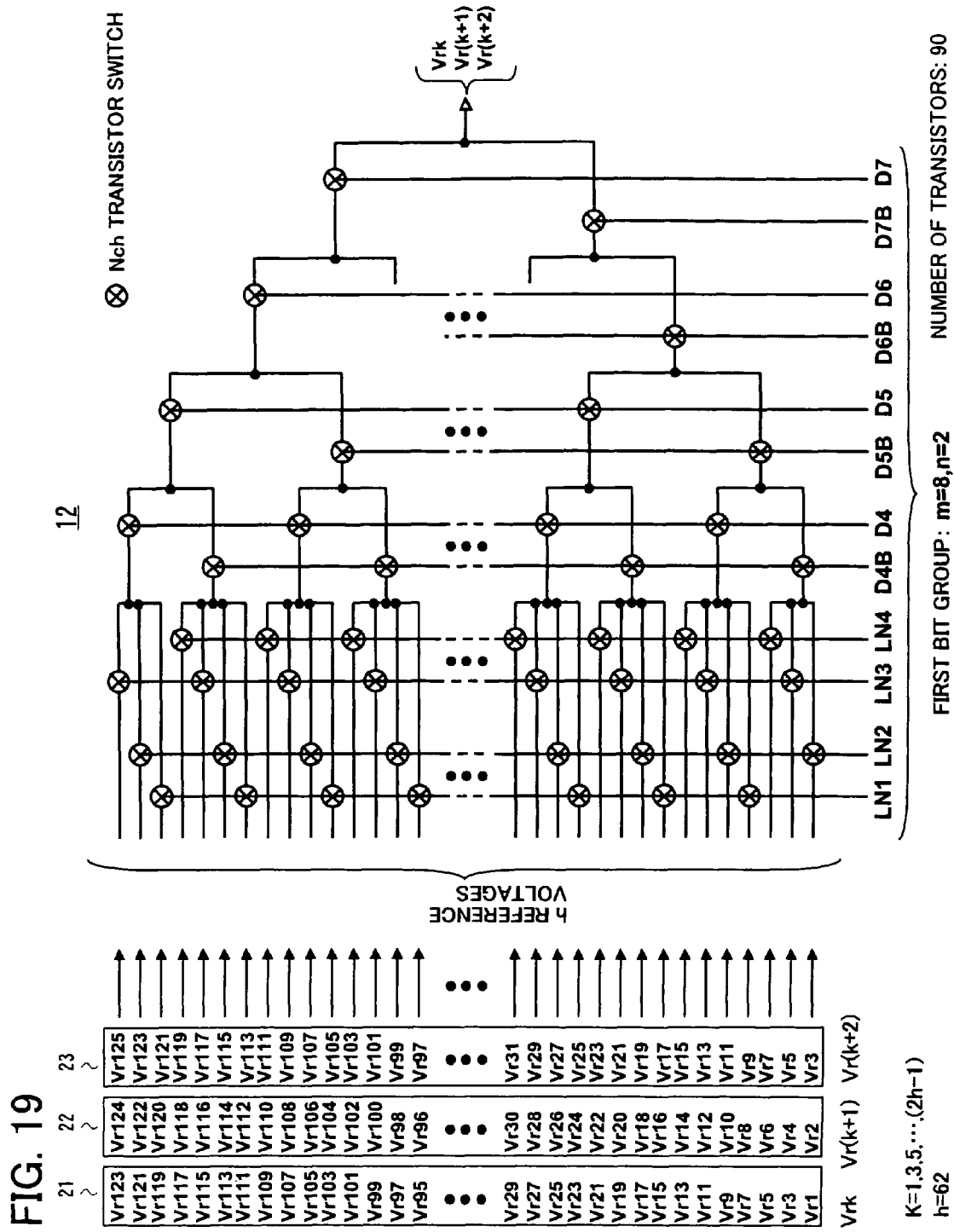
FIG. 19 is a diagram illustrating the configuration of the subdecoder 11 of FIG. 2 in the concrete example of FIG. 12.

FIG. 19 is a diagram illustrating the configuration of the subdecoders $12_1$, $12_2$ and $12_3$ (identically constructed) of FIG. 18. This is a case in which the switches are constituted by Nch transistors. With reference to FIG. 19, the subdecoder 12 is so adapted that the Nch switching transistors which are connected to the lower and upper ends Vr1 and Vr127 of the subdecoder 12 having the h=64 ($2^6$) configuration in FIG. 7 and which are turned on and off by LN1 and LN4 are deleted.

More specifically, in the subdecoder 12 shown in FIG. 19, Vr1, Vr2 and Vr3 are connected to Nch transistor switches that are turned on when respective ones of the signals LN2, LN3 and LN4 that have been decoded by the predecoder 14 of FIG. 3 attain the high level.

The next four reference voltages Vr4, Vr5, Vr6 and Vr7 are connected to Nch transistor switches that are turned on when respective ones of the signals LN1, LN2, LN3 and LN4 that have been decoded by the predecoder 14 of FIG. 3 attain the high level. The four reference voltages Vr111, Vr113, Vr115 and Vr117 are connected to Nch transistor switches that are turned on when respective ones of the signals LN1, LN2, LN3 and LN4 that have been decoded by the predecoder 14 of FIG. 3 attain the high level. Further, reference voltages Vr119, Vr121 and Vr123 are connected to Nch transistor switches that are turned on when respective ones of the signals LN2, LN3 and LN4 that have been decoded by the predecoder 14 of FIG. 3 attain the high level.

The Nch transistor switches connected to respective ones of (D4, D4B) select one reference voltage of the reference voltages in the two adjacent sets composed of three reference voltages and four reference voltages that have been selected by LN1, LN2, LN3 and LN4 [e.g., one reference voltage selected from among the three reference voltages (Vr1, Vr3, Vr5) and one reference voltage selected from among the four reference voltages (Vr7, Vr9, Vr11, Vr13), and one reference voltage selected from among the four reference voltages (Vr111, Vr113, Vr115, Vr117) and one reference voltage selected from among the three reference voltages (Vr119, Vr121, Vr123)].

In the case of Nch transistor switches connected to respective ones of (D5, D5B), one of the two reference voltages that have been selected by the Nch transistor switches connected to respective ones of (D4, D4B) is selected; in the case of Nch transistor switches connected to respective ones of (D6, D6B), one of two reference voltages that have been selected by the Nch transistor switches connected to respective ones of (D5, D5B) is selected; and in the case of Nch transistor switches connected to respective ones of (D7, D7B), one reference voltage Vrk of two reference voltages that have been selected by the Nch transistor switches connected to respective ones of (D6, D6B) is output. The total number of transistor switches of this subdecoder 12 is 90.

When (D3,D2)=(0,0) holds in the subdecoder $12_1$, LN1 attains the high level and Vr7, Vr15, Vr23, . . . , and Vr119 are selected; when (D3,D2)=(0,1) holds, LN2 goes high and Vr1, Vr9, Vr17, . . . , and Vr121 are selected; when (D3,D2)=(1,0) holds, LN3 goes high and Vr3, Vr11, . . . , and Vr123 are selected, and when (D3,D2)=(1,1) holds, LN4 goes high and Vr5, Vr13, . . . , and Vr117 are selected.

The outputs Vrk, Vr(k+1) and Vr(k+2) from the subdecoders $12_1$, $12_2$ and $12_3$ are supplied to the fourth subdecoder 13, and the fourth subdecoder 13 selects two voltages Vo1 and Vo2 (which may be identical) and inputs the voltages to terminals T1 and T2 of the amplifying circuit 30.

The fourth reference voltage group 24 (Vrd1, Vrd2, Vrd3, Vrd4) are supplied to a fifth subdecoder 41. The fifth subdecoder 41 receives as inputs the outputs (LN1, LN2, LN3, LN4) of the predecoder 14 to which (D3,D2) of the first bit group (D7 to D2) are supplied, (D7 to D4) of the first bit group (D7 to D2) and the second bit group (D1, D0). When the first bit group (D7 to D2) is "000000", one among Vrd1, Vrd2, Vrd3 and Vrd4 is selected by the second bit group (D1,D0), is output as Vo3 and Vo4 and is supplied to the terminals T1 and T2 of the amplifying circuit 30.

In a case where the first bit group (D7 to D2) is "000001" to "111111", the fifth subdecoder 41 turns off the paths between the outputs Vo3 and Vo4 and Vrd1, Vrd2, Vrd3 and Vrd4.

The fifth reference voltage group 25 (Vr125, Vrd5, Vrd6, Vrd7) is supplied to a sixth subdecoder 42. The sixth subdecoder 42 receives as inputs the outputs (LN1, LN2, LN3, LN4) of the predecoder 14 to which (D3,D2) of the first bit group (D7 to D2) are supplied, (D7 to D4) of the first bit group (D7 to D2) and the second bit group (D1, D0). When the first bit group (D7 to D2) is "111111", the fifth reference voltage group 25 is activated, selects one reference voltage by the second bit group (D1,D0), outputs this as Vo5 and Vo6 and inputs this to terminals T1 and T2 of the amplifying circuit 30. In a case where the first bits group (D7 to D2) is "000000" to "111110", the sixth subdecoder 42 turns off the paths between the outputs Vo5, Vo6 and Vr125, Vrd5, Vrd6 and Vrd7.

Figure 20A:
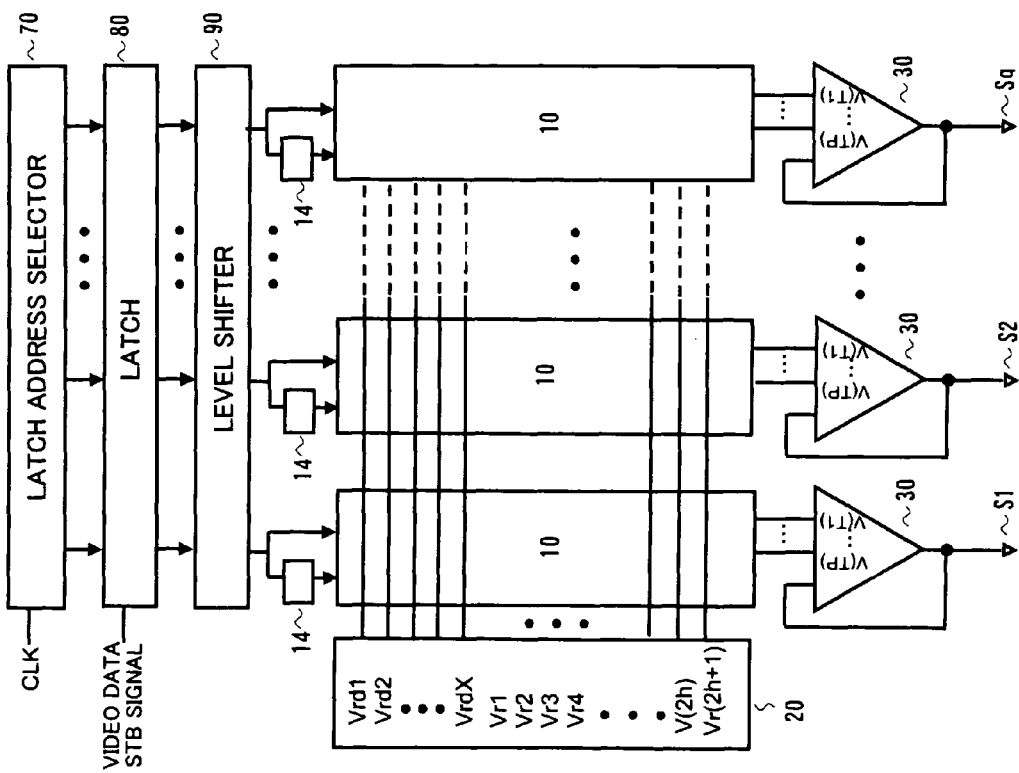
FIGS. 20A and 20B are diagrams illustrating the configuration of a data driver in this exemplary embodiment.

FIG. 20A is a diagram illustrating the configuration of a data driver having the above-described decoder 10 and amplifying circuit 30. FIG. 20 illustrates the main portions of the data driver in the form of blocks. As shown in FIG. 20A, the data driver includes a latch address selector 70, a latch 80, a level shifter 90, a reference voltage generating circuit 20, decoders 10 and amplifying circuits 30.

The latch address selector 70 decides the timing of the data latch based upon a clock signal CLK. The latch 80 latches video digital data based upon the timing decided by the latch address selector 70 and outputs data to the decoders 10 in unison via the level shifter 90 in accordance with an STB signal (strobe signal). The latch address selector 70 and latch 80 are logic circuits and generally operate at low voltages (0 3.3. V).

Figure 20B:
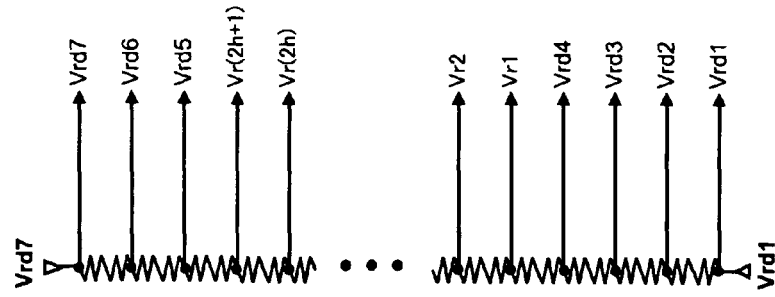
Figure 21:
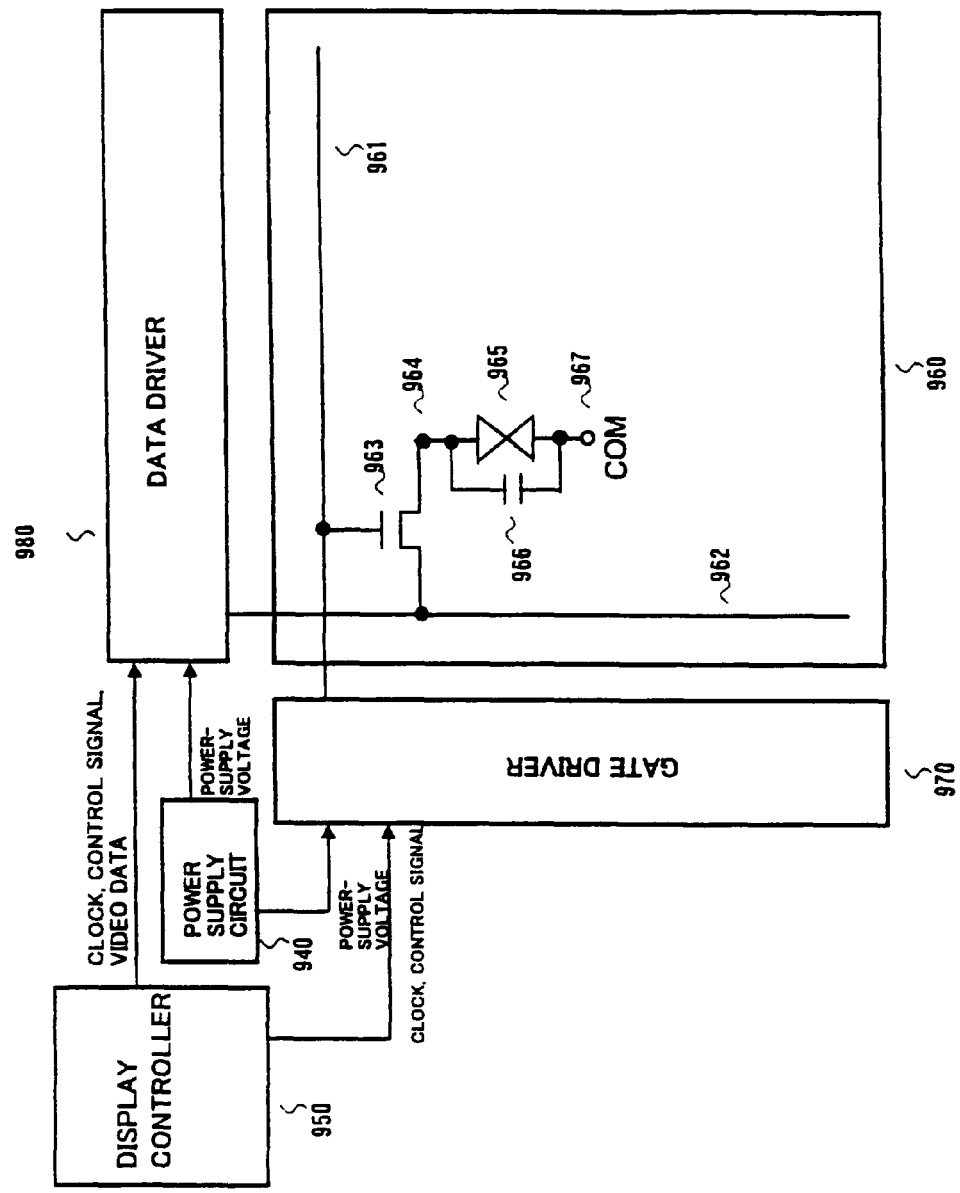
FIG. 21 is a diagram illustrating the configuration of an active-matrix liquid crystal display device.

As illustrated in FIG. 20B, the reference voltage generating circuit 20 generates at least (2h+1)-number of reference voltages of Vr1 to Vr(2h+1). The reference voltages [Vr1, Vr3, Vr(2h−1)] form a first reference voltage group, the reference voltages [Vr2, Vr4, Vr(2h)] form a second reference voltage group and the reference voltages [Vr3, Vr5, Vr(2h+1)] form a third reference voltage group. The reference voltage groups are supplied to respective ones of first to third subdecoders.

In the case of the exemplary embodiment of FIG. 17A, reference voltages Vrd1 to Vrd7 are generated by the reference voltage generating circuit 20. The reference voltages (Vrd1, Vrd2, Vrd3, Vrd4) form a fifth reference voltage group, and the reference voltages [Vr(2h+1), Vrd5, Vrd6, Vrd7] form a sixth reference voltage group. The fifth and sixth reference voltage groups are supplied to fifth and sixth subdecoders (see FIG. 18), respectively, in the decoder 10. The decoders 10 select a plurality of reference voltages that are in accordance with entered digital data and supply the reference voltages to the input terminals T1 to TP of the amplifying circuits 30. The amplifying circuits 30 output voltages obtained by combining (interpolating) input voltages V(T1) to V(TP).

Though the present invention has been described in accordance with the foregoing exemplary embodiments, the invention is not limited to these exemplary embodiments and it goes without saying that the invention covers various modifications and changes that would be obvious to those skilled in the art within the scope of the claims.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A digital-to-analog converter circuit comprising:
first to third reference voltage groups, into which first to $(2 \times h+1)$th reference voltages are grouped, where h is a prescribed positive integer,
the first reference voltage group including h-number of $(2 \times j-1)$th reference voltages, the second reference voltage group including h-number of $(2 \times j)$th reference voltages, and the third reference voltage group including h-number of $(2 \times j+1)$th reference voltages, where j is a prescribed positive integer of 1 to h;
a first selecting circuit that receives the h-number reference voltages of the first reference voltage group and selects a first reference voltage based upon an input digital signal supplied thereto;
a second selecting circuit that receives the h-number reference voltages of the second reference voltage group and selects a second reference voltage based upon the input digital signal supplied thereto;
a third selecting circuit that receives the h-number reference voltages of the third reference voltage group and selects a third reference voltage based upon the input digital signal supplied thereto;
a fourth selecting circuit that receives the first to third reference voltages, respectively selected by the first to third selecting circuits, selects two of the reference voltages from the first to third reference voltages, inclusive of selecting the same voltage redundantly, based upon an input digital signal supplied thereto, and outputs the selected two reference voltages; and
an amplifier circuit that receives the two reference voltages selected by the fourth selecting circuit and outputs a result of an operation applied to the two reference voltages.

2. The digital-to-analog converter circuit according to claim 1, wherein, when the first selecting circuit selects a pth reference voltage of the first reference voltage group, i.e., a $(2 \times p-1)$th reference voltage, based upon the input digital signal, where p is any integer from 1 to h,
the second selecting circuit selects a pth reference voltage of the second reference group, i.e., a $(2 \times p)$th reference voltage, based upon the input digital signal, and
the third selecting circuit selects a pth reference voltage of the third reference group, i.e., a $(2 \times p-1)$th reference voltage, based upon the input digital signal.

3. The digital-to-analog converter circuit according to claim 1, wherein prescribed higher order bits, inclusive of a most significant bit, of the input digital signal are supplied to the first to third selecting circuits, and
prescribed lower order bits, inclusive of a least significant bit, of the input digital signal are supplied to the fourth selecting circuit.

4. The digital-to-analog converter circuit according to claim 1, wherein prescribed higher order bits, inclusive of a most significant bit, of the input digital signal are supplied to the first to third selecting circuits, and
prescribed lower order bits, inclusive of a least significant bit, of the input digital signal are supplied to the fourth selecting circuit, the prescribed higher order bits and the prescribed lower order bits not including bits that are duplicates of each other.

5. The digital-to-analog converter circuit according to claim 1, further comprising a predecoder that receives a prescribed bit field of the prescribed higher order bits of the input digital signal and decodes the prescribed bit field of f the input digital signal;

wherein a decoded output by the predecoder and a bit signal of the prescribed higher order bits of the input digital signal, with the exception of the prescribed bit field, are supplied to the first to third selecting circuits.

6. The digital-to-analog converter circuit according to claim 1, wherein the amplifier circuit receives the two reference voltages, selected by the fourth selecting circuit, inclusive of the same voltage selected redundantly, and outputs a voltage obtained by interpolating the two reference voltages received at the first and second input terminals.

7. The digital-to-analog converter circuit according to claim 6, wherein in a case where the two reference voltages selected by the fourth selecting circuit, inclusive of the same voltage selected redundantly, are the same, the amplifier circuit outputs a voltage identical with the two reference voltages that are the same.

8. The digital-to-analog converter circuit according to claim 1, wherein the amplifying circuit receives the two reference voltages selected by the fourth selecting circuit, inclusive of the same voltage selected redundantly, at first, second and third input terminals, and outputs a voltage obtained by weighting the voltages at the first, second and third input terminals by prescribed coefficients.

9. The digital-to-analog converter circuit according to claim 1, wherein a reference voltage group of a first range of voltages different from a voltage range of the first to $(2 \times h+1)$th reference voltages is provided; and the circuit further comprises a fifth selecting circuit that receives the reference voltage group of the first range of voltages as an input and selects two reference voltages in accordance with the input digital signal.

10. The digital-to-analog converter circuit according to claim 9, wherein a reference voltage group of a second range of voltages different from the voltage range of the first to $(2 \times h+1)$th reference voltages and different from the first range of voltages is provided; and the circuit further comprises a sixth selecting circuit that receives the reference voltage group of the second range of voltages as an input and selects two reference voltages in accordance with the input digital signal.

11. The digital-to-analog converter circuit according to claim 1, wherein, with respect to the first to $(2 \times h+1)$th reference voltages, voltages of $4 \times h$ levels are output in correspondence with values of the input digital signal.

12. The digital-to-analog converter circuit according to claim 1, wherein, with respect to the first to $(2 \times h+1)$th reference voltages, voltages of $8 \times h$ levels are output in correspondence with values of the input digital signal.

13. The digital-to-analog converter circuit according to claim 1, wherein, in case h satisfies the relation $2^{(m-1)} < h \leq 2^m$, higher order m bits of the input digital signal are supplied to the first to third selecting circuits, and one reference voltage among the h-number of reference voltages is selected.

14. The digital-to-analog converter circuit according to claim 1, wherein the fourth selecting circuit selects the two reference voltages, inclusive of selecting the same voltage redundantly, from among the three reference voltages, which have been selected by the first to third selecting circuits, by the lower order two bits of the input digital signal, and outputs the two reference voltages to two output nodes, respectively.

15. The digital-to-analog converter circuit according to claim 1, wherein the fourth selecting circuit selects the two reference voltages, inclusive of selecting the same voltage redundantly, from among the three reference voltages, which have been selected by the first to third selecting circuits, by the lower order three bits of the input digital signal, and outputs the two reference voltages to three output nodes.

16. The digital-to-analog converter circuit according to claim 1, wherein the first to $(2 \times h+1)$th reference voltages are equally spaced apart from each other.

17. A data driver including the digital-to-analog converter circuit, as set forth in claim 1, the digital-to-analog converter circuit receiving an input digital signal conforming to an input video signal and outputting a voltage conforming to the input digital signal.

18. A display device having unit pixels, each of which includes a pixel switch and a display element, provided at intersections of data lines and scan lines, wherein signals on the data lines are written to the display elements via pixel switches that have been turned on by the scan lines;

the display device having the data driver as set forth in claim 17, as a data driver for driving the data lines.

19. A display device comprising:

a plurality of data lines extending in parallel with one another along a first direction;

a plurality of scan lines extending in parallel with one another in a direction perpendicular to the first direction;

a plurality of pixel electrodes arranged in matrix form at intersections of the plurality of data lines and the plurality of scan lines;

a plurality of transistors corresponding to respective ones of the plurality of pixel electrodes, each transistor having a drain and a source one of which is connected to the corresponding pixel electrode and the other of which is connected to a corresponding data line, and a gate connected to a corresponding scan line;

a gate driver that supplies scan signals to respective ones of the plurality of scan lines; and a data driver that supplies gray-scale signals, which correspond to input data, to respective ones of the plurality of data lines;

the data driver comprising the data driver as set forth in claim 17.

20. A digital-to-analog converter circuit comprising:

a first reference voltage group including a prescribed number of reference voltages in which a predetermined first voltage is at one end of a range of voltages and mutually adjacent reference voltages are spaced apart from each other by $2 \times$(a unit voltage);

a second reference voltage group including a prescribed number of reference voltages in which a voltage spaced apart from the first voltage by the unit voltage is at one end of a range of voltages and mutually adjacent reference voltages are spaced apart from each other by $2 \times$(the unit voltage);

a third reference voltage group including a prescribed number of reference voltages in which a voltage spaced apart from the first voltage by $2 \times$(the unit voltage) is at one end of a range of voltages and mutually adjacent reference voltages are spaced apart from each other by $2 \times$(the unit voltage);

a first selecting circuit that selects a reference voltage located at an ordinal position, which is designated by an input digital signal, from the one end of the voltage range of the first reference voltage group;

a second selecting circuit that selects a reference voltage located at an ordinal position, which is designated by the input digital signal, from the one end of the voltage range of the second reference voltage group;

a third selecting circuit that selects a reference voltage located at an ordinal position, which is designated by the input digital signal, from the one end of the voltage range of the third reference voltage group;

a fourth selecting circuit that receives the voltages selected by respective ones of the first to third selecting circuits, selects two voltages inclusive of the same voltage redundantly, and outputs the two voltages; and an operational circuit that receives the two voltages selected by the fourth selecting circuit and outputs result of a prescribed operation applied to the two voltages; and the reference voltages selected by the first to third selecting circuits are spaced part from each other by the unit voltage.

21. A method of digital-to-analog conversion comprising:

grouping first to $(2 \times h+1)$th reference voltages, where h is a prescribed positive integer, into:

a first reference voltage group including h-number of $(2 \times j-1)$th reference voltages, a second reference voltage group including h-number of $(2 \times j)$th reference voltages, and a third reference voltage group including h-number of $(2 \times j+1)$th reference voltages, where j is a prescribed positive integer of 1 to h;

selecting a first reference voltage based upon an input digital signal from the h-number reference voltages of the first reference voltage group;

selecting a second reference voltage based upon the input digital signal from the h-number reference voltages of the second reference voltage group;

selecting a third reference voltage based upon the input digital signal from the h-number reference voltages of the third reference voltage group;

selecting two of the reference voltages from the first to third reference voltages, inclusive of selecting the same voltage redundantly, based upon an input digital signal; and outputting a result of an operational amplification applied to the two reference voltages.

22. The method according to claim 21, wherein the first to $(2 \times h+1)$th reference voltages are equally spaced apart from each other.

* * * * *